(12) United States Patent
Sublett et al.

(10) Patent No.: US 11,967,845 B2
(45) Date of Patent: Apr. 23, 2024

(54) SECURED CABINET FOR CHARGING PORTABLE BATTERIES

(71) Applicant: Benchmark Craftsman Inc., Seville, OH (US)

(72) Inventors: Nathan A. Sublett, Seville, OH (US); Robert Manthey, Seville, OH (US)

( * ) Notice: Subject to any disclaimer, the term of this patent is extended or adjusted under 35 U.S.C. 154(b) by 389 days.

(21) Appl. No.: 17/399,636

(22) Filed: Aug. 11, 2021

(65) Prior Publication Data
US 2023/0046777 A1 Feb. 16, 2023

(51) Int. Cl.
*H02J 7/00* (2006.01)
*H02B 1/30* (2006.01)
*H02B 1/56* (2006.01)
*H05K 5/00* (2006.01)
*H05K 7/20* (2006.01)

(52) U.S. Cl.
CPC ............. *H02J 7/0044* (2013.01); *H02B 1/30* (2013.01); *H02B 1/565* (2013.01); *H02J 7/0013* (2013.01); *H05K 5/0004* (2013.01); *H05K 7/20554* (2013.01)

(58) Field of Classification Search
CPC .... H02J 7/0044; H02J 7/0013; H02J 7/00309; H02B 1/30; H02B 1/565; H05K 5/0004; H05K 7/20554; B60L 58/27; B60L 2240/545; B60L 53/80; Y02T 10/70; Y02T 10/7072
USPC ........................................................ 320/107
See application file for complete search history.

(56) References Cited

U.S. PATENT DOCUMENTS

| | | | |
|---|---|---|---|
| 6,603,660 B1 * | 8/2003 | Ehn | H04Q 1/14 361/695 |
| 7,055,833 B2 | 6/2006 | Wixted et al. | |
| 8,934,254 B2 | 1/2015 | Petrick et al. | |
| 10,283,984 B2 | 5/2019 | Maguire et al. | |
| 10,412,853 B2 | 9/2019 | Dombrowski et al. | |
| 10,703,211 B2 | 7/2020 | Chuang | |
| 10,916,953 B2 * | 2/2021 | Reber | H05K 7/18 |
| 2010/0290605 A1 * | 11/2010 | Wright | H05K 7/20945 379/102.04 |
| 2011/0183599 A1 * | 7/2011 | German | H01M 10/6566 454/343 |
| 2019/0124794 A1 * | 4/2019 | Caulfield | H02B 1/565 |

FOREIGN PATENT DOCUMENTS

EP     3402019 B1 *   3/2021  ............ H01H 33/08

* cited by examiner

*Primary Examiner* — M Baye Diao
(74) *Attorney, Agent, or Firm* — Emerson, Thomson & Bennett, LLC; Roger D. Emerson

(57) ABSTRACT

A charging cabinet is disclosed having a frame, a center vertical member, wherein the center vertical member includes a lock plate, a plurality of stock chargers, an exhaust system, configured to vent heat from the charging cabinet to cool the at least one battery, a heater, configured to warm the at least one battery, a pair of duplex receptacles, a pass-thru connector recess box, wherein the pass-thru connector recess box is angled downward, a pass-thru connector mount box, wherein the pass-thru connector mount box is angled upward, an inlet connector recess box, wherein the inlet connector recess box is angled downward, and an inlet connector mount box, wherein the inlet connector mount box is angled upward.

20 Claims, 22 Drawing Sheets

US 11,967,845 B2

SECURED CABINET FOR CHARGING PORTABLE BATTERIES

TECHNICAL FIELD

The present teachings generally pertain to the field of chargers for portable batteries. More specifically, to a locking, battery charging cabinet with a plurality of stock chargers.

I. BACKGROUND

When using battery-powered tools, quick and efficient charging of the battery packs are often desired. However, recharging the battery packs on a job site delays progress and is inconvenient when an individual is mid-task.

While additional pre-charged batteries can be used to limit this problem, such batteries lose their charge over time and are exposed to various weather conditions that can affect the battery's effectiveness.

Additionally, because battery packs are often small in size, individuals leave job sites with the battery packs, costing employers and purchasers of the batteries extra money.

Therefore, what is needed is a secured, locking cabinet for charging portable batteries. Further, the charging cabinet should be thermostatically controlled to maintain an optimal temperature environment for the batteries while charging.

II. SUMMARY

Provided in this disclosure is a charging cabinet that includes a frame, a center vertical member, wherein the center vertical member includes a lock plate that engages with a lock member, a plurality of stock chargers, wherein the plurality of stock chargers have a plurality of ports for charging at least one battery, an exhaust system, configured to vent heat from the charging cabinet to cool the at least one battery, a heater, configured to warm the at least one battery, a pair of duplex receptacles, a pass-thru connector recess box, wherein the pass-thru connector recess box is angled downward, a pass-thru connector mount box, wherein the pass-thru connector mount box is angled upward, an inlet connector recess box, wherein the inlet connector recess box is angled downward, and an inlet connector mount box, wherein the inlet connector mount box is angled upward.

In accordance with one aspect of the present, teachings, the frame comprises: a first outer side panel, a second outer side panel that includes the pair of duplex receptacles, a first inner side panel that includes the plurality of stock chargers, a second inner side panel that includes the plurality of stock chargers, an inner rear panel, an outer rear panel, a base panel, a first door panel, and a second door panel having a handle member.

In accordance with another aspect of the present teachings, the charging cabinet locks and secures the at least one battery when charging on the plurality of stock chargers.

In accordance with yet another aspect of the present teachings, the charging cabinet is thermostatically controlled.

In accordance with still another aspect of the present teachings, the charging cabinet supplies enough power to chain multiple charging cabinets together for charging.

In accordance with another aspect of the present teachings, a charging cabinet is disclosed having a frame, a center vertical member, wherein the center vertical member includes a lock member, a plurality of stock chargers, wherein the plurality of stock chargers have a plurality of ports for charging at least one battery, a cooling fan, configured to vent heat from the charging cabinet to cool the at least one battery, a recess box, wherein a daisy chain is fastened within the recess box; and a power pack, positioned to receive the daisy chain.

Other benefits and advantages of this invention will become apparent to those skilled in the art to which it pertains upon reading and understanding of the following detailed specification.

III. BRIEF DESCRIPTION OF THE DRAWINGS

The invention may take physical form in certain parts and arrangement of parts, aspects of which will be described in detail in this specification and illustrated in the accompanying drawings which form a part hereof and wherein.

IV. DETAILED DESCRIPTION

Figure 1:
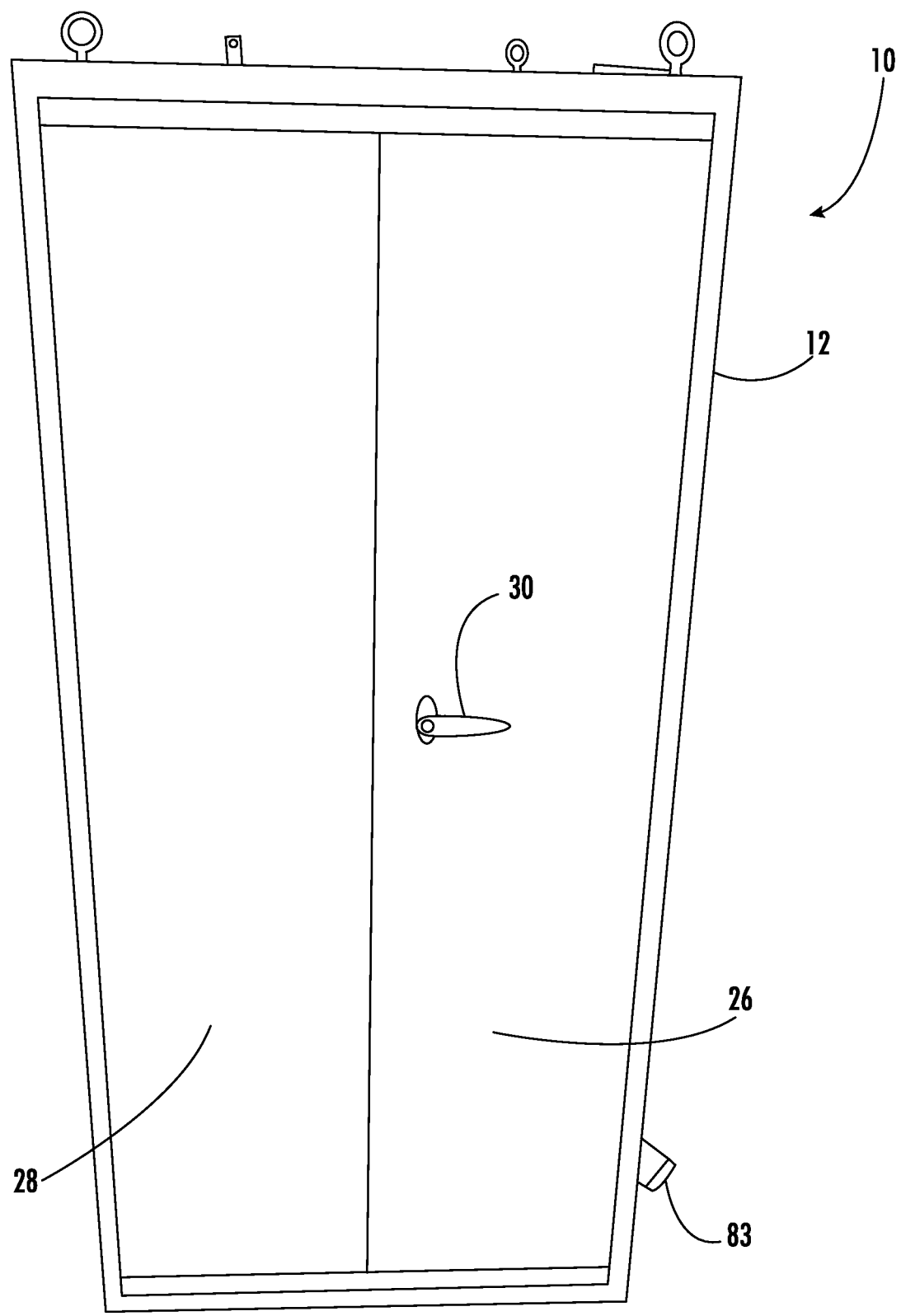
FIG. 1 is a front view of a charging cabinet with a first door panel and a second door panel in a closed position.

Referring now to the drawings wherein the showings are for purposes of illustrating the present teachings of the article only and not for purposes of limiting the same, and wherein like reference numerals are understood to refer to like components.

Figure 2:
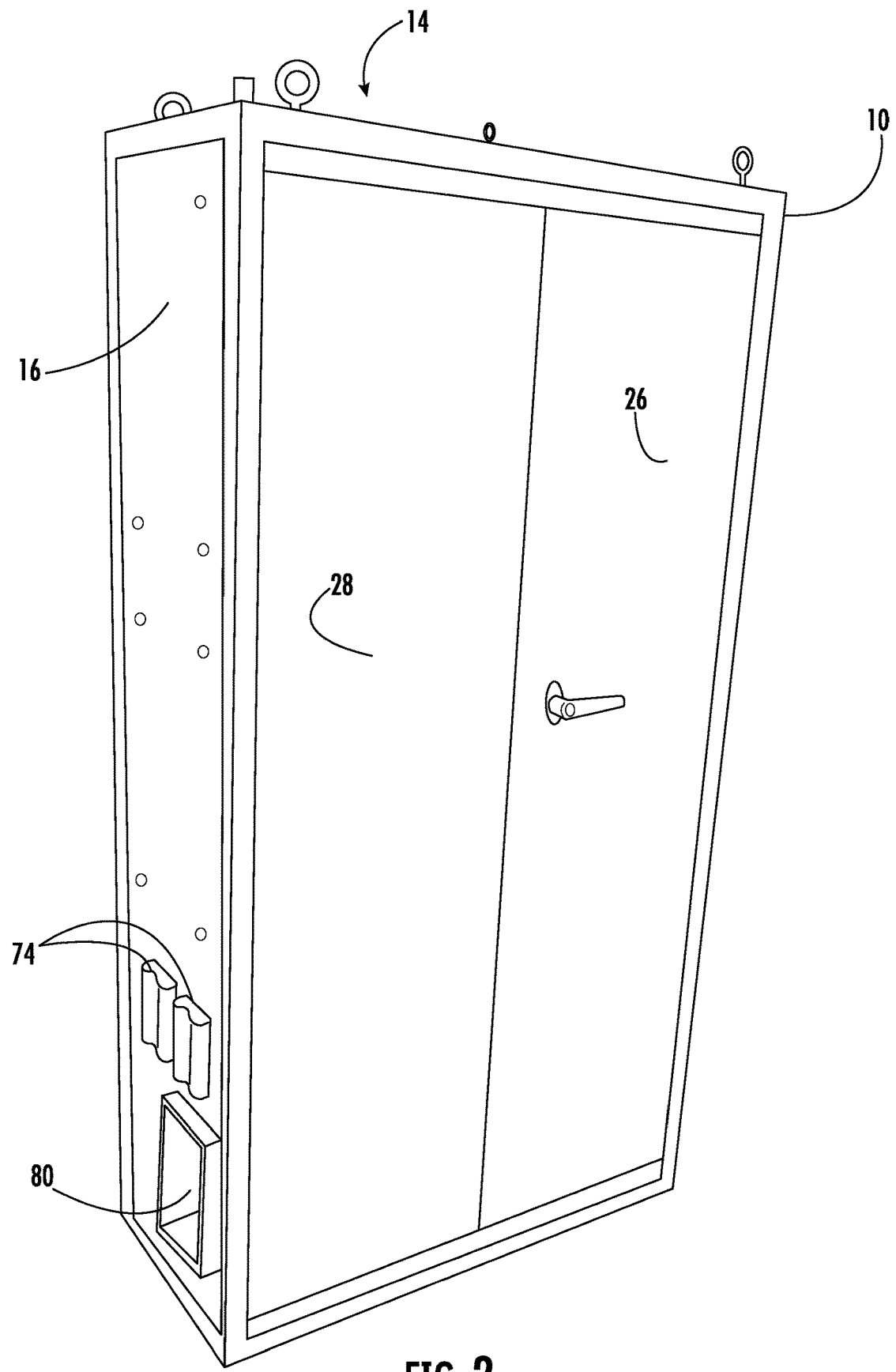
FIG. 2 is a perspective side view of the charging cabinet.
Figure 3:
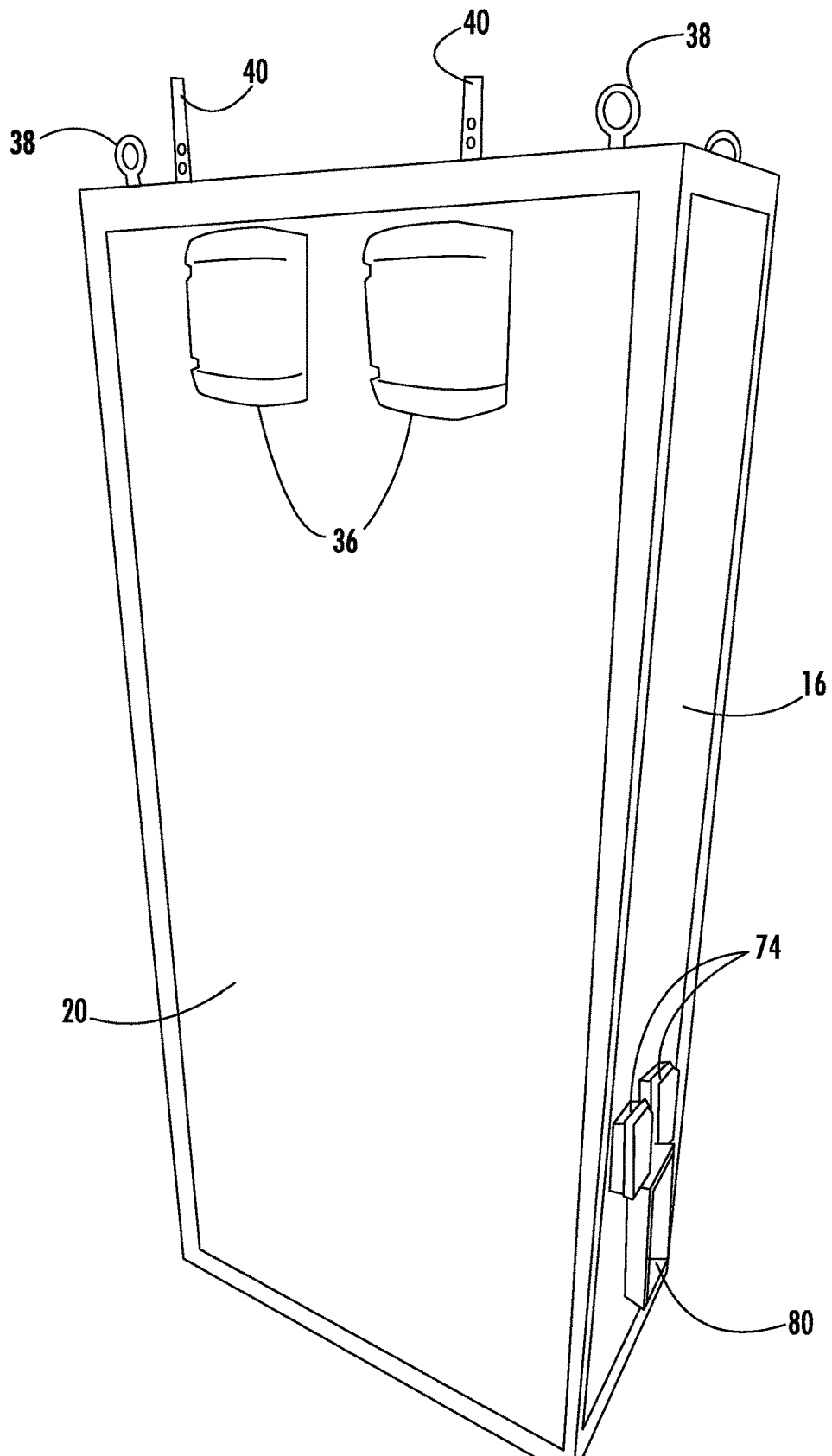
FIG. 3 is a perspective back view of the charging cabinet.

Referring to FIGS. 1-3, a charging cabinet 10 is provided according to some aspects of this invention. The charging cabinet 10 may have a frame 12 that encloses the charging cabinet 10. The frame 12 comprises a first outer side panel 15, a second outer side panel 16, an outer rear panel 20, a first door panel 26, and a second door panel 28. In one aspect of the present teaching, the frame 12 can be fabricated from 11-gauge ("ga") angle steel. In this aspect, the frame 12 fabrication from 11 ga angle steel increases the strength of the charging cabinet 10 when lifting and transporting.

Figure 7:
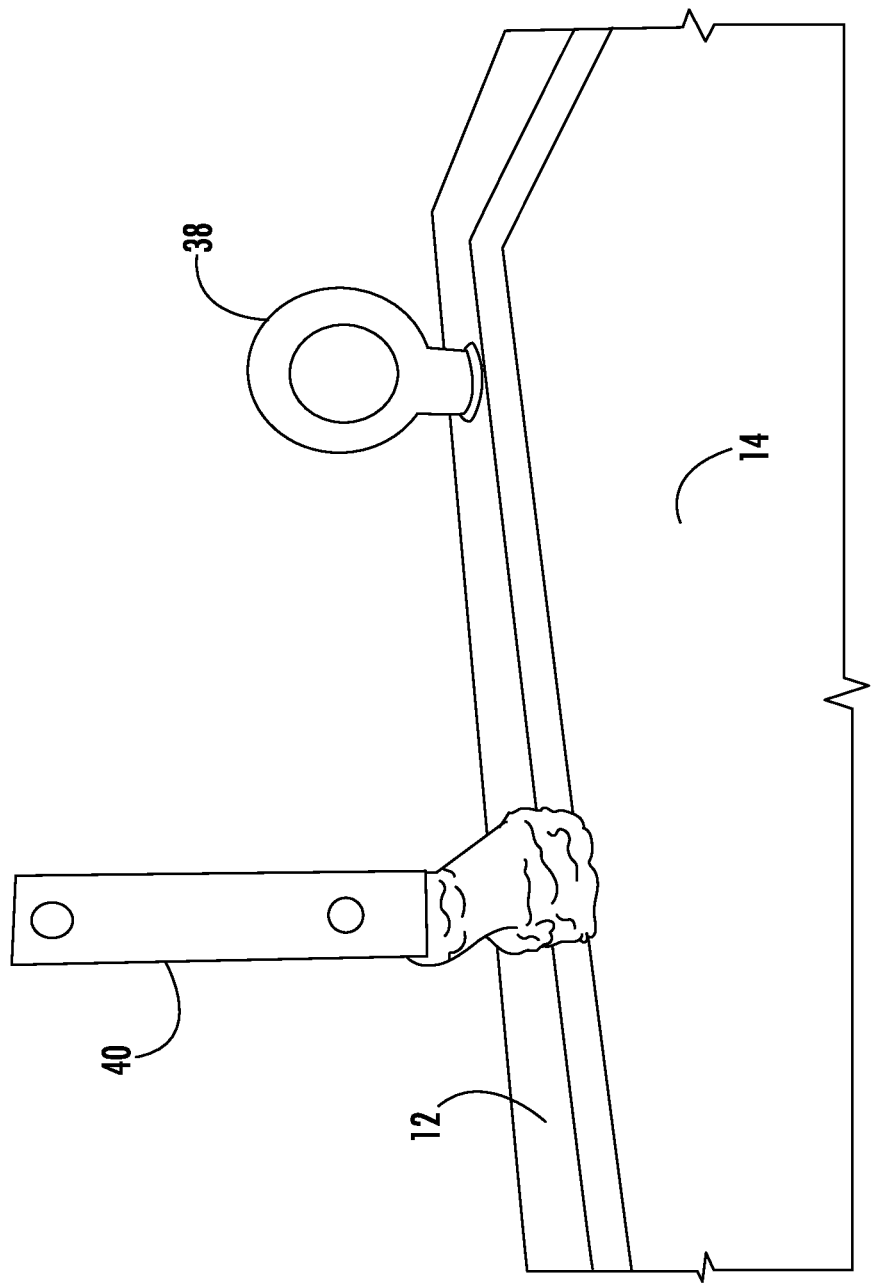
FIG. 7 is a view of a hook and a bracket on a top panel of the charging cabinet.

Now referring to FIGS. 2 and 7, the frame 12 further comprises a top panel 14. In one aspect of the present teaching, a plurality of hooks 38 are fastened to the frame 12 on the top panel 14. Note that the plurality of hooks 38 aid in lifting and transporting the charging cabinet 10. In this aspect, the plurality of hooks 38 can be fastened anywhere along the frame 12 on the top panel 14. In another aspect of the present teaching, a plurality of brackets 40 are fastened to the frame 12 on the top panel 14. Note that the plurality of brackets 40 prevent the charging cabinet 10 from tipping and causing injury or damage. In this aspect, the plurality of brackets 40 can be fastened anywhere along the frame 12 on the top panel 14.

Figure 4:
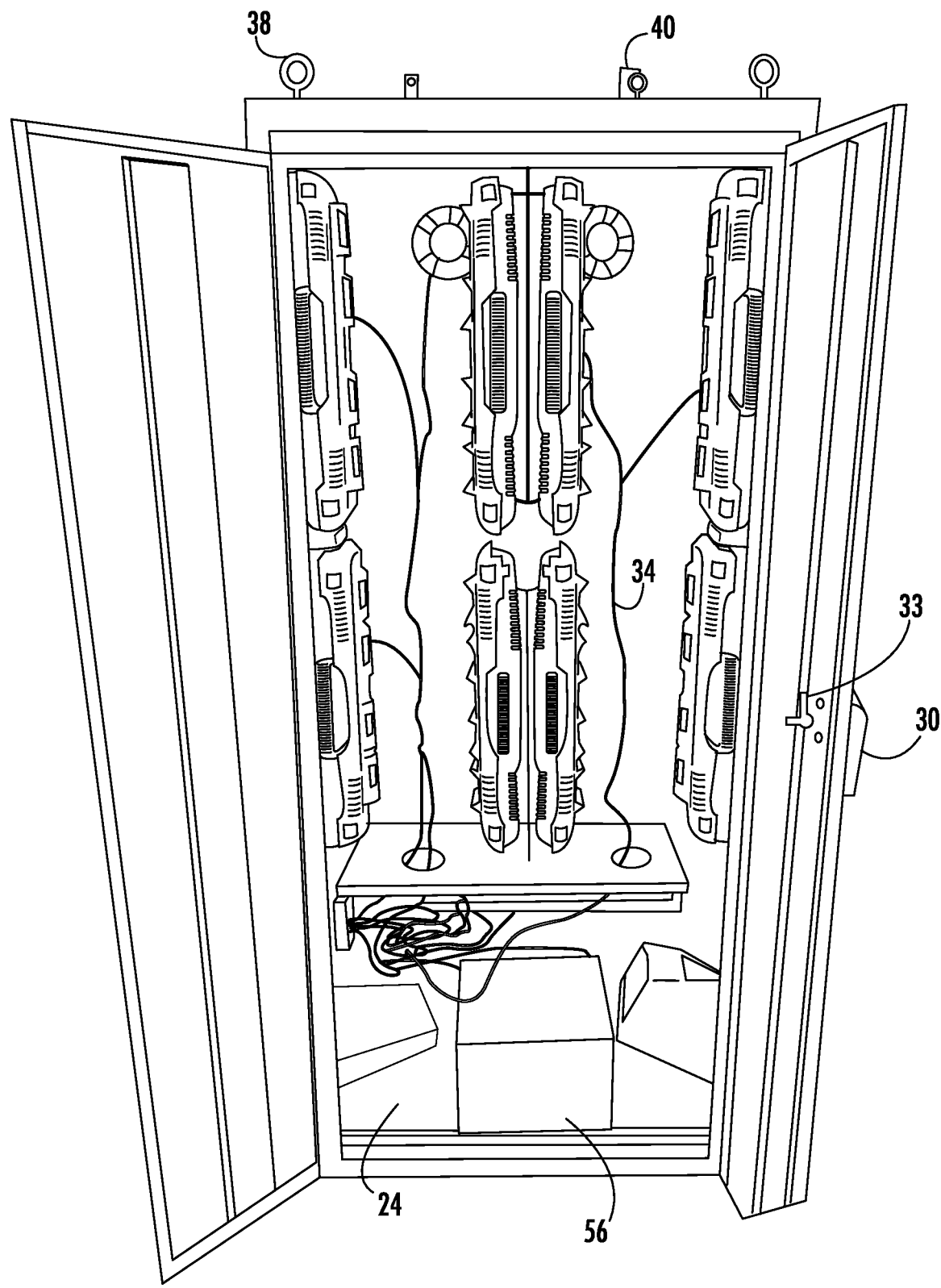
FIG. 4 is a front view of the charging cabinet with the first door panel and the second door panel in an open position.
Figure 5:
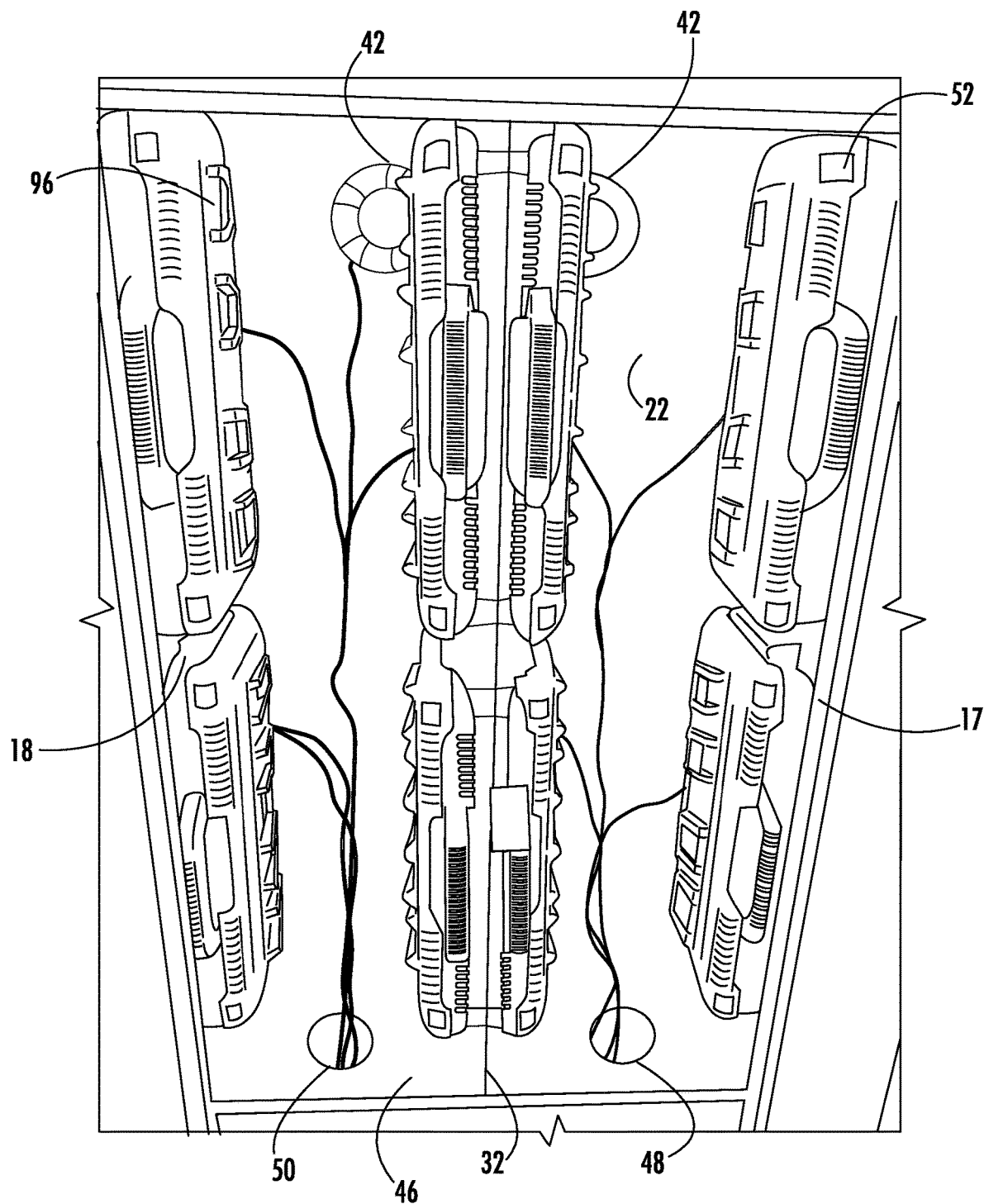
FIG. 5 is a close-up view of the charging cabinet shown in FIG. 4.
Figure 6:
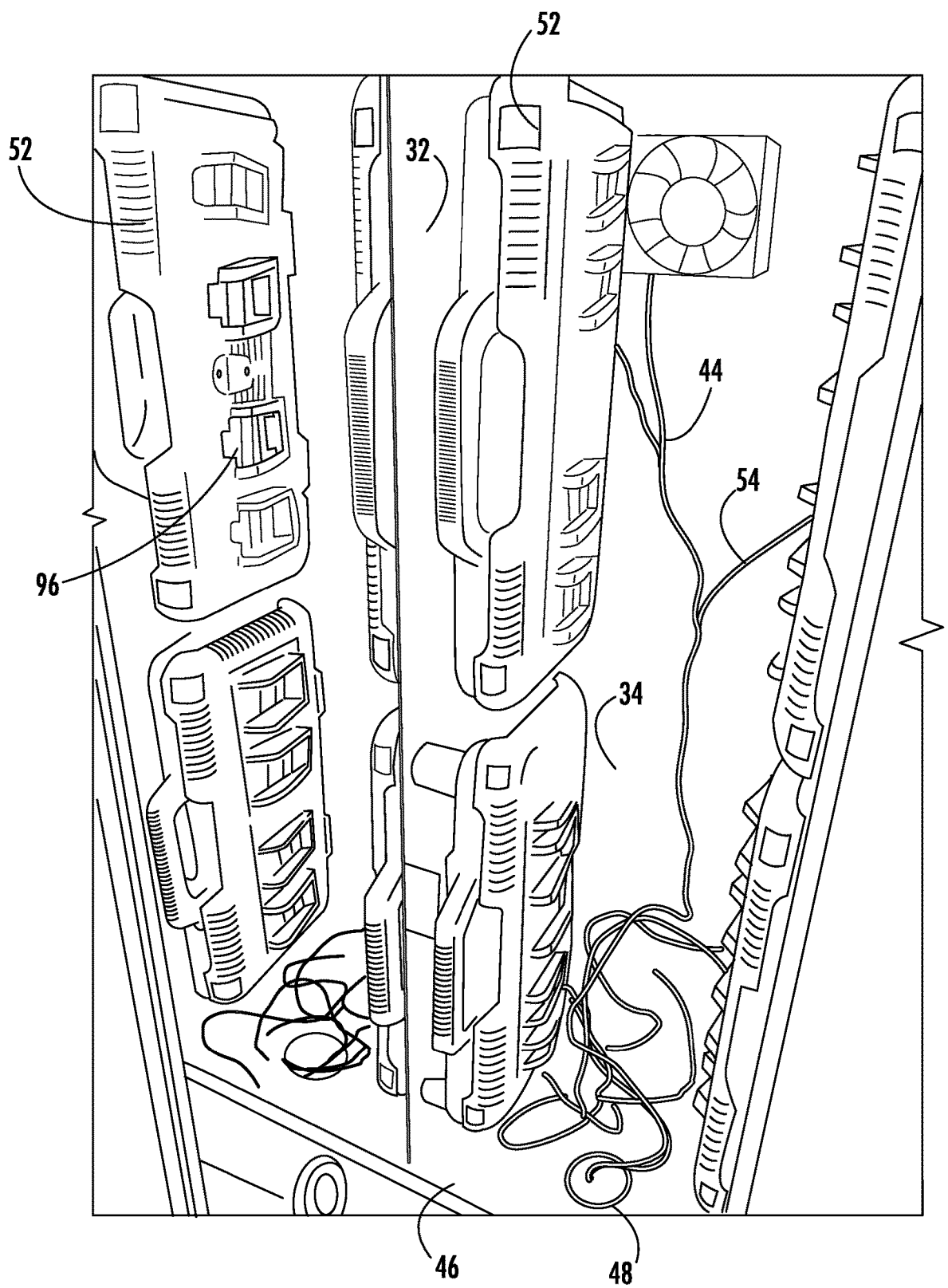
FIG. 6 is a perspective view of the charging cabinet shown in FIG. 5.

Now referring to FIGS. 4-6, the frame 12 further comprises a first inner side panel 17, a second inner side panel 18, an inner rear panel 22, and a base panel 24. A plurality of stock chargers 52 are vertically mounted to the first inner side panel 17 and the second inner side panel 18. The plurality of stock chargers 52 include a plurality of ports 96 that engage with an at least one battery 98. In one aspect of the present invention, the stock chargers 52 are DeWalt DBC104 that output 8-ampere ("amp") per port 96.

Further referring to FIGS. 4-6, the plurality of stock chargers 52 can be mounted on a center vertical member 32 that is located vertically and centrally between the first inner side panel 17 and the second inner side panel 18. To support the center vertical member 32, a shelf member 46 is horizontally mounted to the first and second inner side panels 17, 18. The center vertical member 32 is fastened from the top panel 14 to the shelf member 46. In one aspect of the present invention, the center vertical member 32 is composed of 11 ga sheet steel to sufficiently support the plurality of stock chargers 52.

With reference to FIGS. 4 and 6, a lock plate 34 is fastened to the center vertical member 32. In one aspect of the present teaching, a lock member 33 engages with the lock plate 34 to close and secure the first door panel 26 and the second door panel 28. The first door panel 26 includes a handle member 30 that enables the lock member 33 to engage with the lack plate 34. In another aspect on the present teaching, the lock plate 34 can be fastened at any location along the center vertical member 32 such that the lock plate 34 aligns with the lock member 33.

With reference now to FIGS. 5 and 6, the inner rear panel 22 includes a pair of exhaust fans 42 with an integral thermostatic control 94 to vent heat from the charging cabinet 10. In one aspect of the present invention, the pair of exhaust fans 42 are mounted on the inner rear panel 22 and located close to the top panel 14 of the charging cabinet 10. Positioning the pair of exhaust fans 42 close to the top panel 14 ensures maximum heat is expelled from the charging cabinet 10 in summertime conditions.

Further referring to FIGS. 5 and 6, a first hole member 48 and a second hole member 50 are added to the shelf member 46. The first and second hole members 48, 50 allow for a plurality of fan cords 44 and a plurality of charger cords 54 to access and connect with the pair of exhaust fans 42 and the stock chargers 52, respectively.

Figure 8:
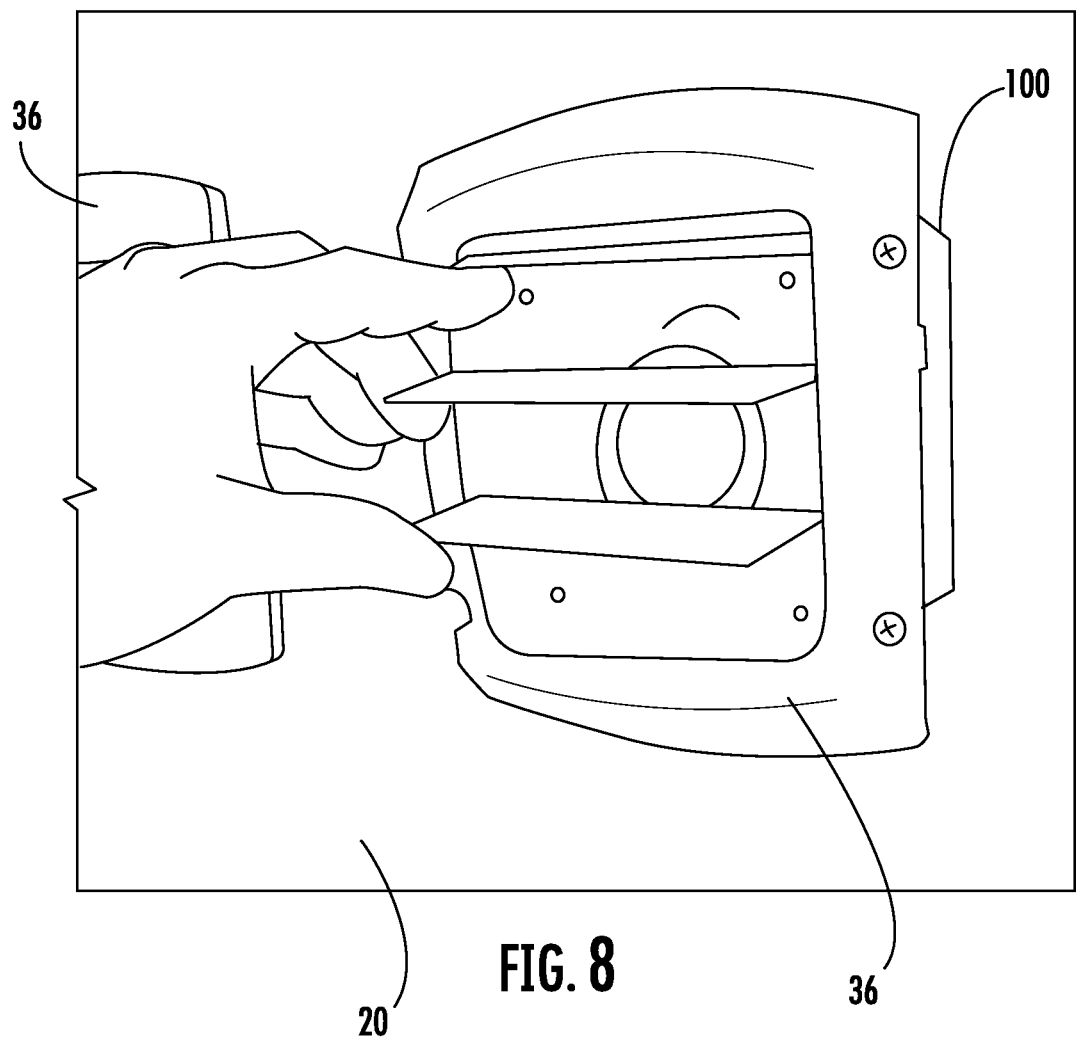
FIG. 8 is a view of a louver output on an outer real panel of the charging cabinet.

With reference to FIGS. 3 AND 8, the outer rear panel 20 includes a pair of exhaust openings 35 to vent heat from the pair of exhaust fans 42. In one aspect of the present teaching, a pair of louvers 36 are fastened to the outer rear panel 20 to cover the pair of exhaust openings 35 and to prevent the ingress of water and debris through the pair of exhaust openings 35. An exhaust system 100 includes the pair of exhaust openings 35, the pair of exhaust fans 42, and the pair of louvers 36.

Figure 9:
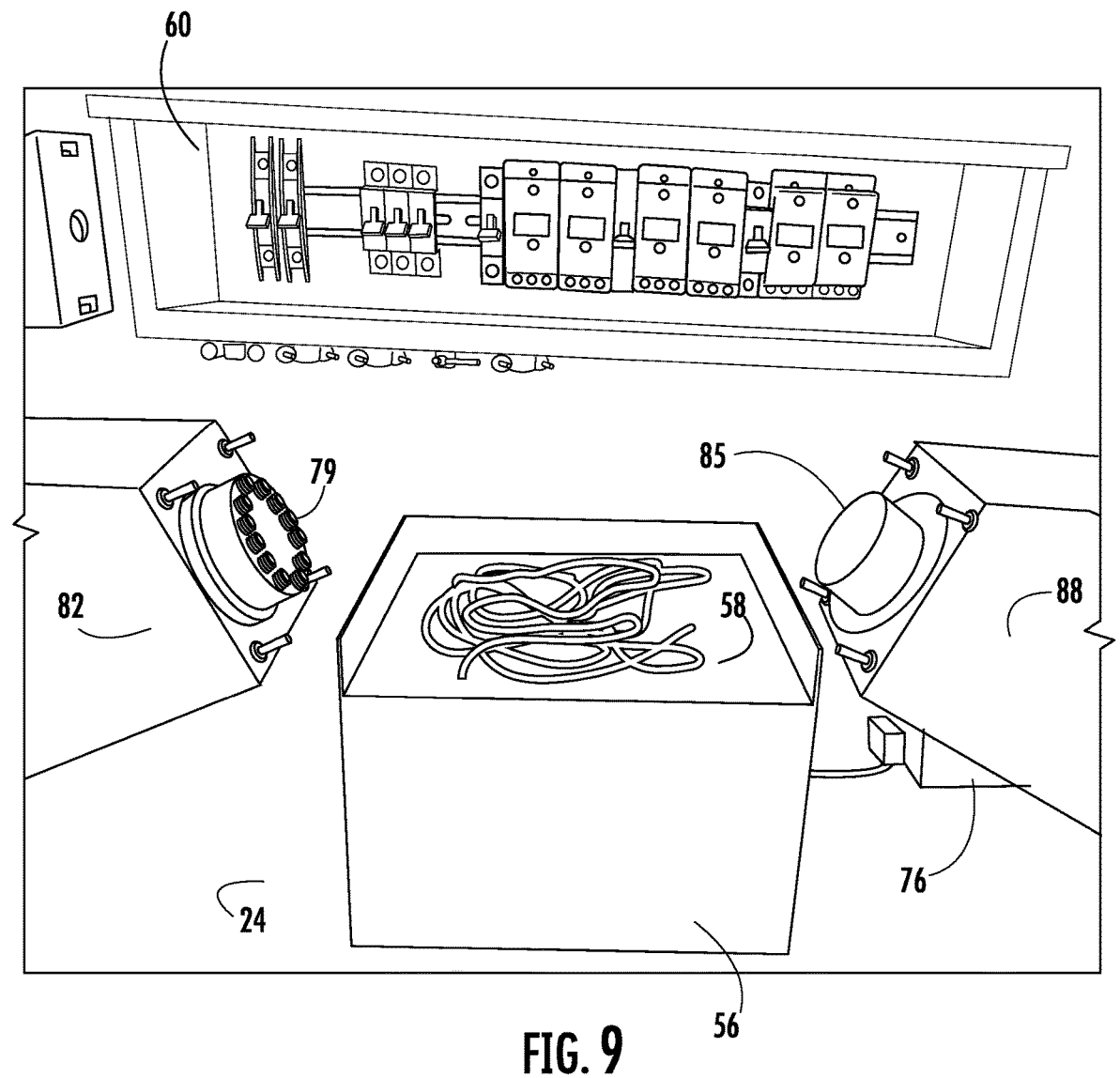
FIG. 9 is a front view of a transformer, an electrical raceway, an inlet connector recess box, and a pass-thru connector recess box.

Now referring to FIGS. 4 and 9, the base panel 24 includes a transformer 56 with an accessible surface 58. The accessible surface 58 allows for easy access to the transformer's 56 wiring. The transformer 56 is mounted to the base panel 24. In one aspect, the transformer 56 is centrally mounted on the base panel 24 as to avoid interference with an inlet connector mount box 82 and a pass-thru connector mount box 88. In another aspect, the transformer 56 receives 480 Volt ("V") 3-phase, while producing 120V single-phase.

Figure 10:
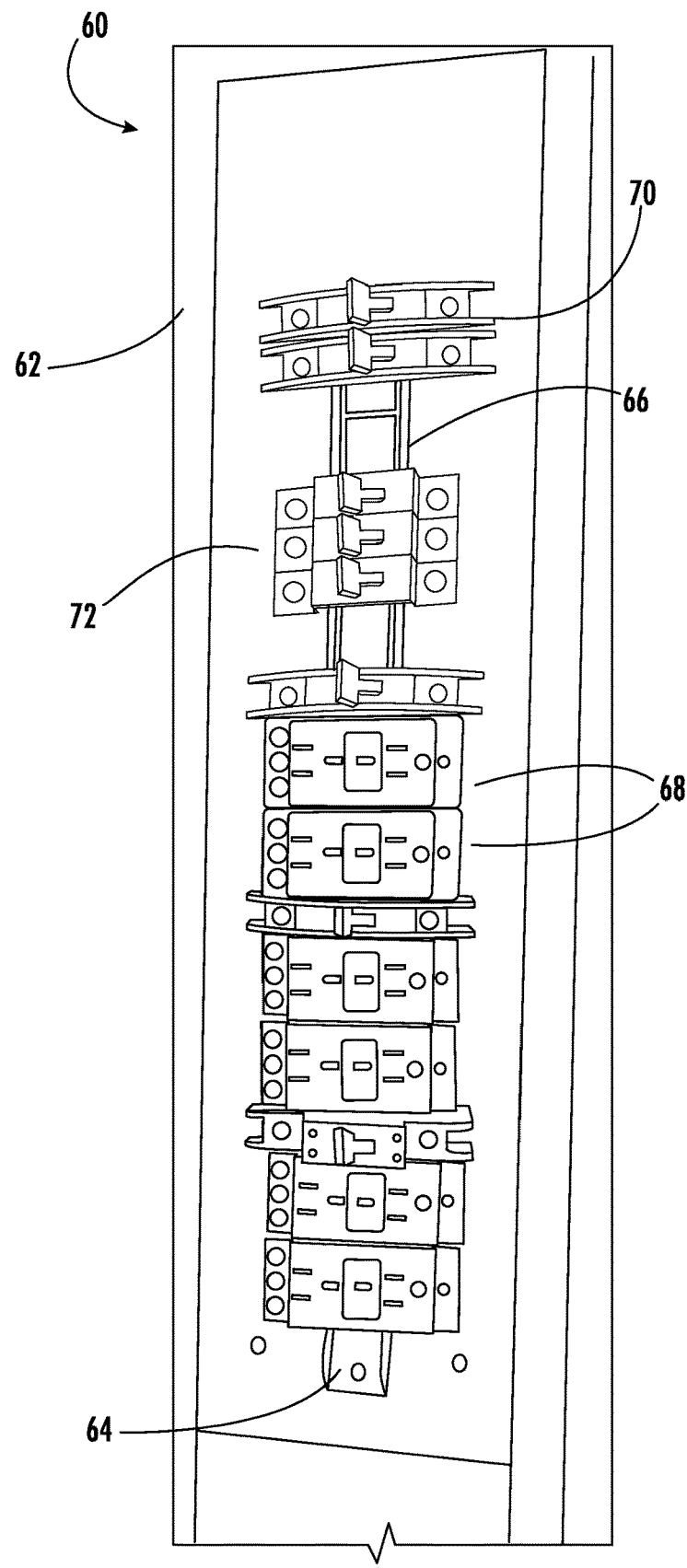
FIG. 10 is a perspective front view of the electrical raceway shown in FIG. 9.
Figure 12:
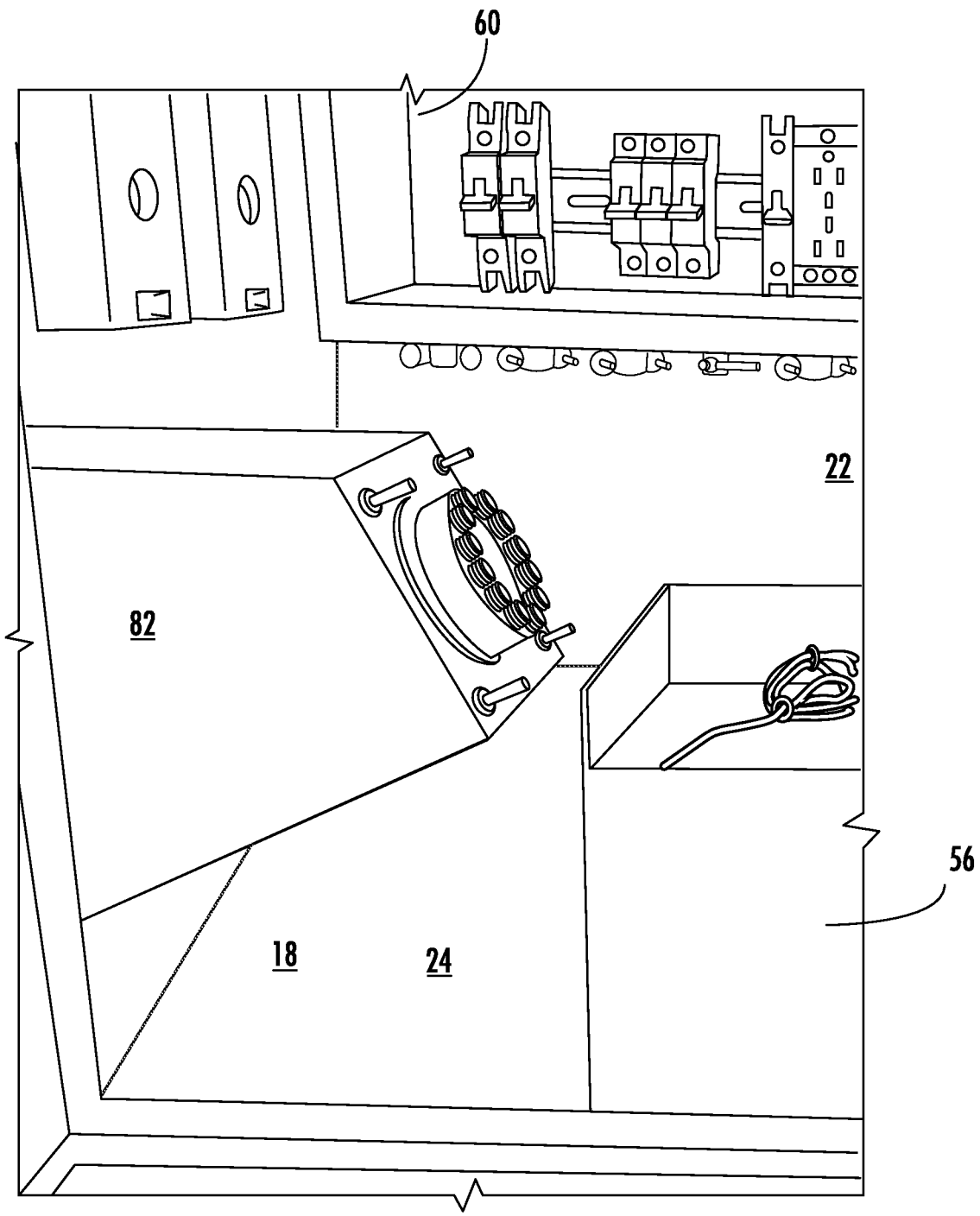
FIG. 12 is a perspective front view of the inlet connector recess box mounted to a second inner side panel of the charging cabinet.

Now referring to FIGS. 9-10 and 12, an electrical raceway 60 is housed in a raceway enclosure 62. In one aspect of the present teaching, the electrical raceway 60 includes a DIN rail 66. Mounting holes 64 allow for attachment of the DIN vial 66 to the electrical raceway 60. In this aspect, the DIN rail 66 includes a plurality of DIN receptacles 68, a plurality of single pole DIN breakers 70, and a 3-pole DIN breaker 72. In another aspect, as shown in FIG. 12, the raceway enclosure 62 is mounted, horizontally, to the inner rear panel 22.

Figure 11:
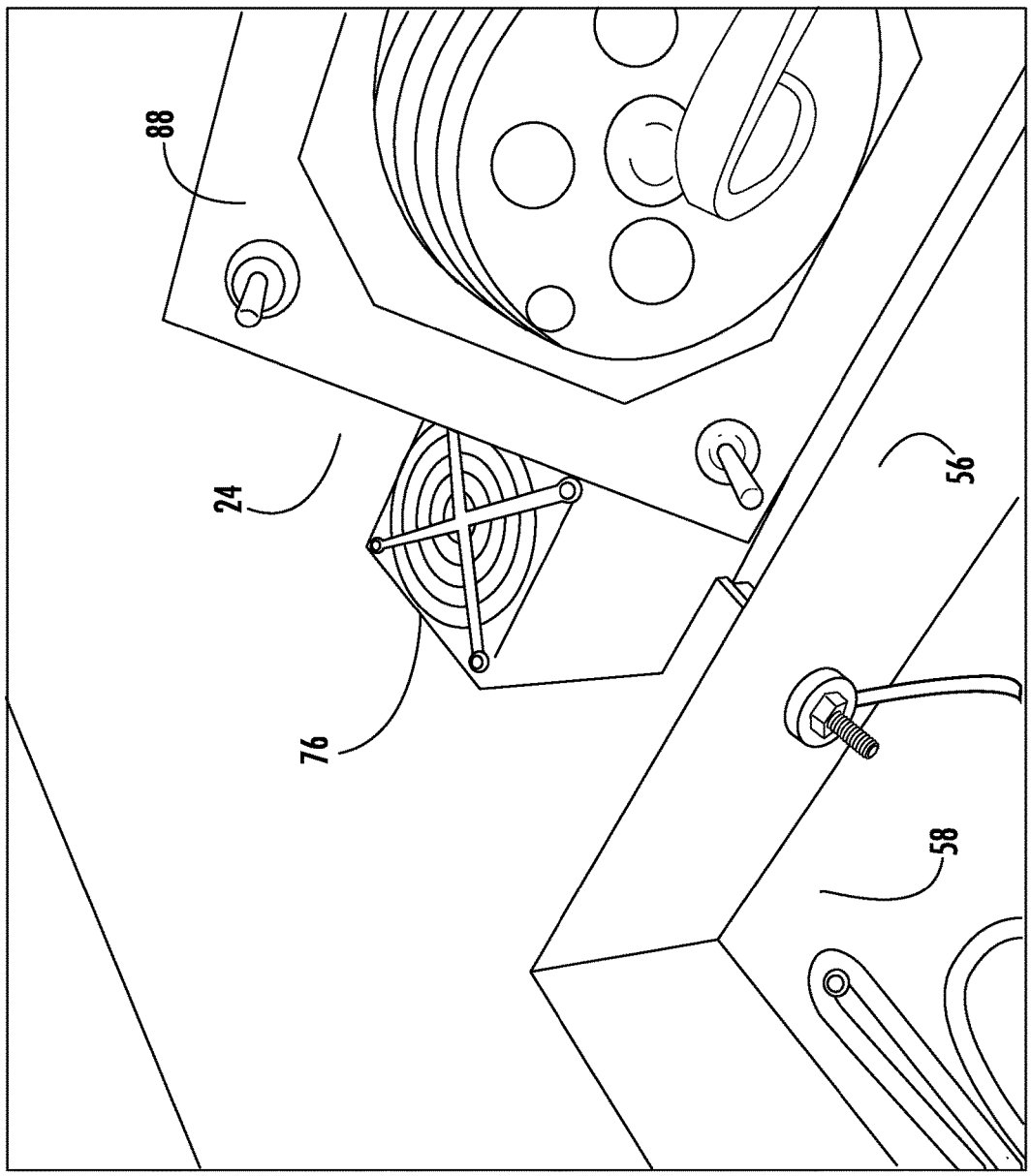
FIG. 11 is a perspective side view of a heater vertically mounter to a base panel of the charging cabinet.
Figure 16:
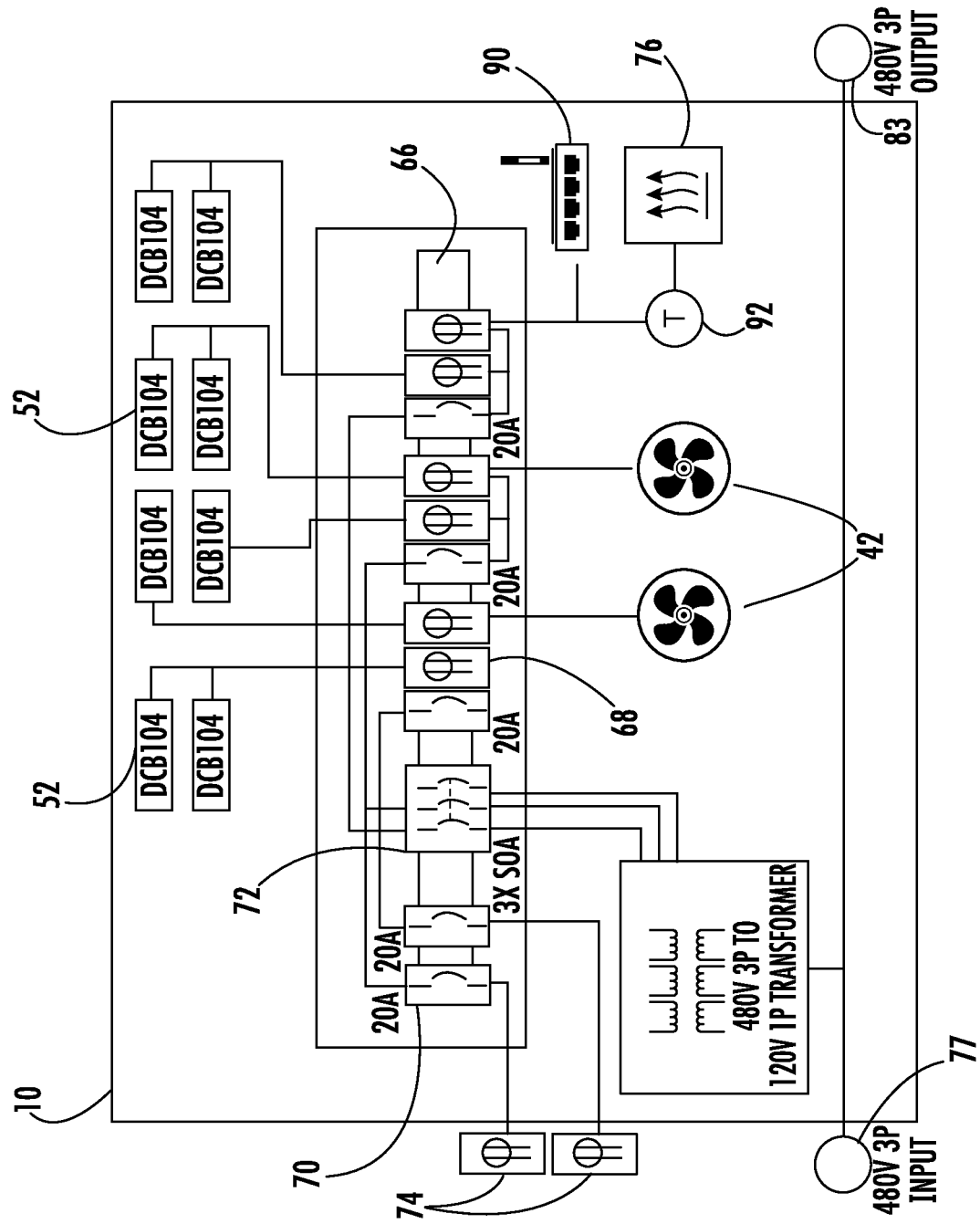
FIG. 16 is an electrical diagram for the charging cabinet.

With reference now to FIGS. 9, 11, and 16, the base panel 24 further includes a heater 76. The heater 76 is vertically mounted to the base panel 24 to allow forced airflow in an upward direction though the charging cabinet 10. The heater 76 placement on the base panel 24 allows for uniform heating of the plurality of stock chargers 52 in wintertime conditions. In one aspect of the present teaching, the heater 76 is electrically connected to an auxiliary thermostatic control 92, as shown in FIG. 16. In another aspect, the heater 76 can include the integral thermostatic control 94.

Figure 13:
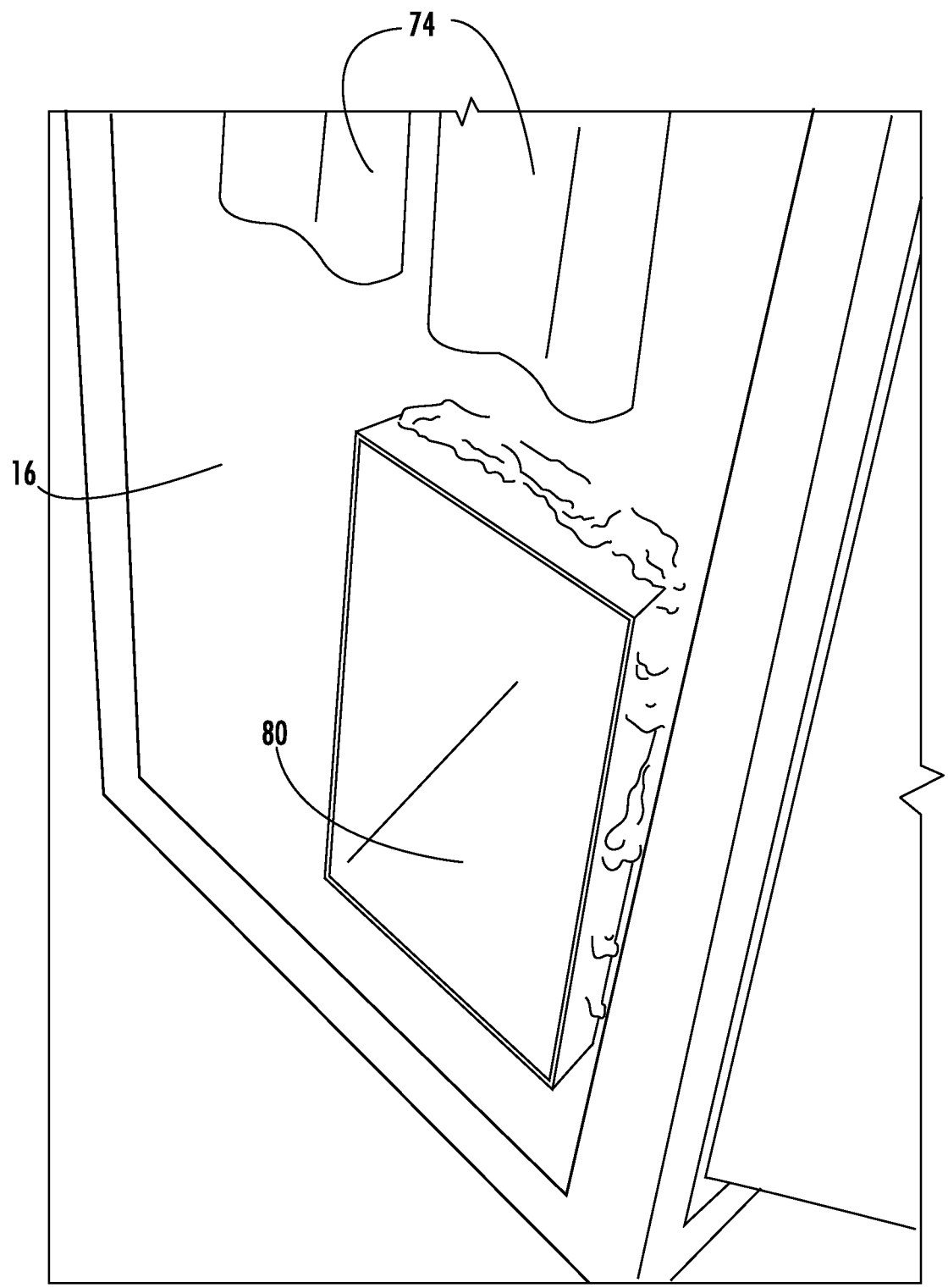
FIG. 13 is a perspective side view of an inlet connector mount box.
Figure 14:
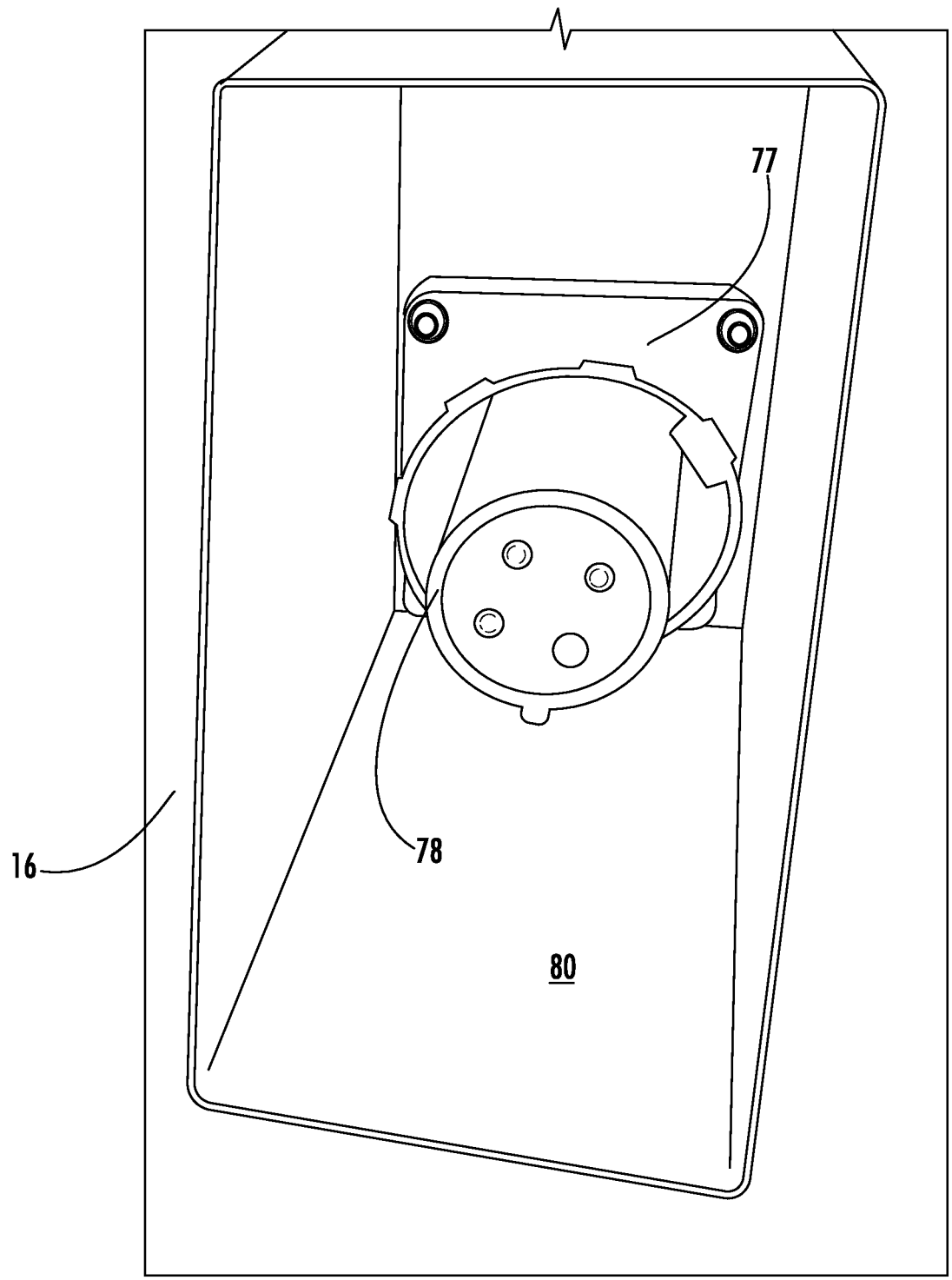
FIG. 14 is a close-up view of the inlet connector mount box shown in FIG. 13.

With reference to FIGS. 2-3 and 13, the second outer side panel 16 includes a pair of duplex receptacles 74 that electrically connect to at least one of the plurality of single pole DIN breakers 70. In one aspect of the present teaching, the pair of duplex receptacles 74 are outdoor rated and are 15-amp. In another aspect of the present teaching, the plurality of single pole DIN breakers 70 are 20-amp.

Now referring to FIGS. 9 and 12-14, the second outer side panel 16 further includes an inlet connector recess box 80. The inlet connector recess box 80 is mounted on the second outer side panel 16 to correspond with the inlet connector mount box 82 fastened on the second inner side panel 18. The inlet connector recess box 80 is positioned at a downward angle that is non-perpendicular to the second outer side panel 16 to reduce the overall width of the charging cabinet 10. The inlet connector mount box 82 is positioned at an upward angle that is non-perpendicular to the second inner side panel 18. Because the inlet connector mount box 82 is not perpendicular to the second inner side panel 18, the transformer 56 can be mounted to the base panel 24 without contact or interference with the inlet connector mount box 82.

Further referring to FIGS. 9 and 12-14, the inlet connector recess box and mount box 80, 82 house an inlet connector 77 having an inlet connector first end 78 and an inlet connector second end 79. The inlet connector first end 78 angularly protrudes (downward) from the inlet connector recess box 80. The downward position of the inlet connector first end 78 within the inlet connector recess box 80 minimizes the overall width of the charging cabinet 10 and limits incidental contact with persons and objects on a job site. Likewise, the inlet connector second end 79 angularly protrudes (upward) from the inlet connector mount box 82. The upward position of the inlet connector second end 79 within the inlet connector mount box 82 minimizes incidental contact with the transformer 56.

Figure 15:
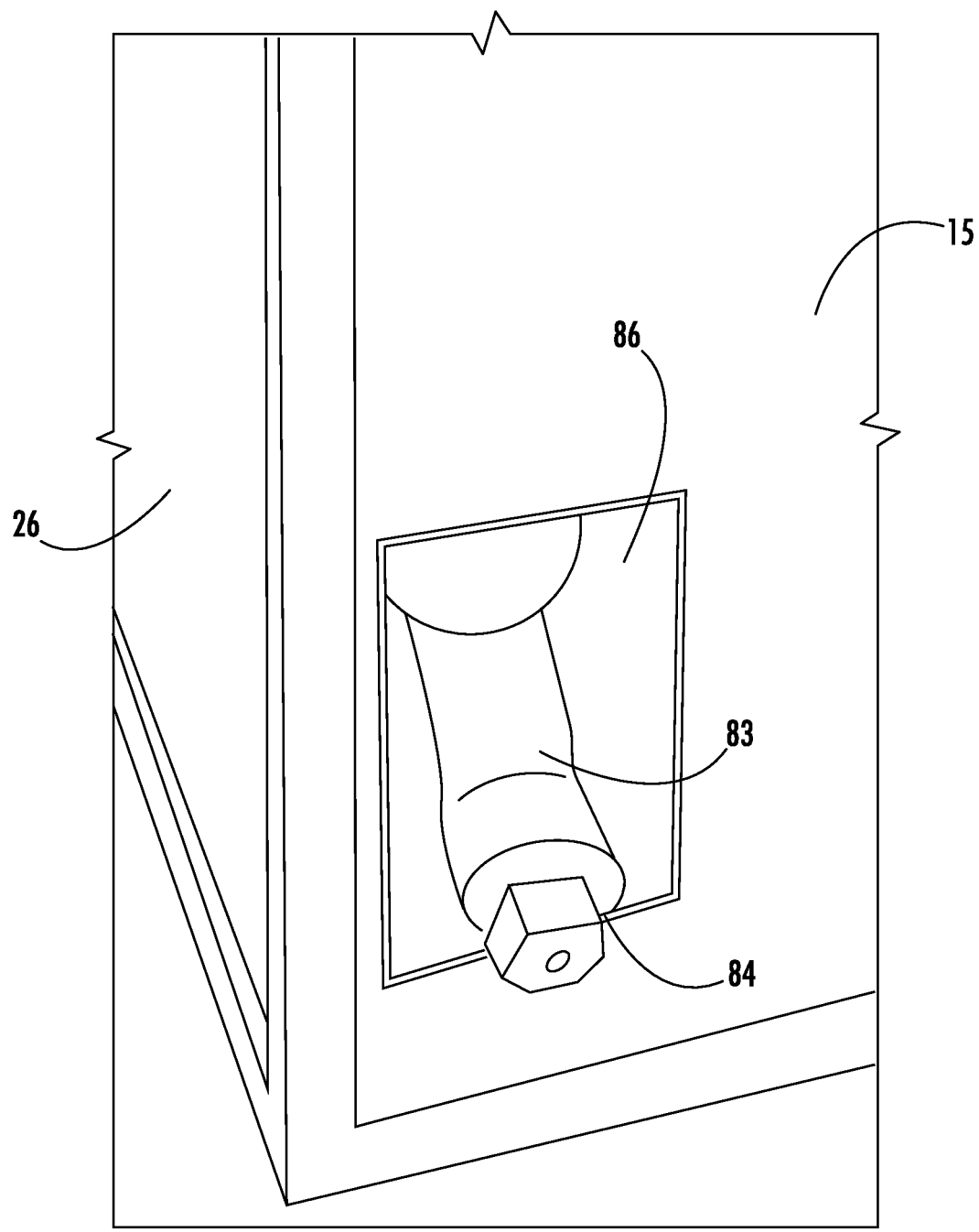
FIG. 15 is a perspective side view of a pass-thus connector mount box and a pass-thru connector.

Now referring to FIGS. 9 and 15, the first outer side panel 15 includes a pass-thru connector recess box 86. The pass-thru connector recess box 86 is mounted on the first outer side panel 15 to correspond with the pass-thru connector mount box 88 fastened on the first inner side panel 17. The pass-thru connector recess box 86 is positioned at a downward angle that is non-perpendicular to the first outer side panel 15 to reduce the overall width of the charging cabinet 10. The pass-thru connector mount box 88 is positioned at an upward angle that is non-perpendicular to the first inner side panel 17. Because the pass-thru connector mount box 88 is not perpendicular to the first inner side panel 17, the transformer 56 can be mounted to the base panel 24 without contact or interference with the pass-thru connector mount box 88.

Further referring to FIGS. 9 and 15, the pass-thru connector recess box and mount box 86, 88 house a pass-thru connector 83 having a pass-thru connector first end 84 and a pass-thru connector second end 85. The pass-thru connector first end 84 angularly protrudes (downward) from the pass-thru connector recess box 86. The downward position of the pass-thru connector first end 84 within the pass-thru connector recess box 86 minimizes the overall width of the charging cabinet 10 and limits incidental contact with persons and objects on a job site. Likewise, the pass-thru connector second end 85 angularly protrudes (upward) from the pass-thru connector mount box 88. The upward position of the pass-thru connector second end 85 within the pass-thru connector mount box 88 minimizes incidental contact with the transformer 56.

Referring to FIG. 16, the electrical diagram for the charging cabinet 10 is illustrated. The inlet connector 77 includes a connectorized input of 480V 3-phase power, while the pass-thru connector 83 includes a connectorized output of 480V 3-phase power. The inlet and pass-thru connectors 77, 83 include 480V 3-phase power to chain multiple charging cabinet 10 together for charging. The transformer 56 receives the 480V 3-phase power and produces 120V single-phase power to the 3-pole DIN breaker 72. In one aspect, the pair of exhaust fans 42 electrically connect to at least one of the plurality of DIN receptacles 68. Likewise, the plurality of stock chargers 52 electrically connect to at least one of the plurality of DIN receptacles 68. In another aspect, the heater 76 and the auxiliary thermostatic control 92 are electrically connected to at least one of the plurality of DIN receptacles 68. In yet another aspect, a WWI gateway 90 can be electrically connected to at least one of the plurality of DIN receptacles 68. Attachment of the WIFI gateway 90 enables users monitor the auxiliary thermostatic control 92 and to monitor the status of the plurality of stock chargers 52.

Referring to FIGS. 17-22, another aspect of the present teaching is illustrated. A charging cabinet 200 is provided having a frame 202 that encloses the charging cabinet 200, shown in FIG. 17. The frame 202 comprises a top panel 204, first outer side panel 206, a second outer side panel 208, an outer rear panel 214, a first door panel 220, and a second door panel 222.

Figure 18:
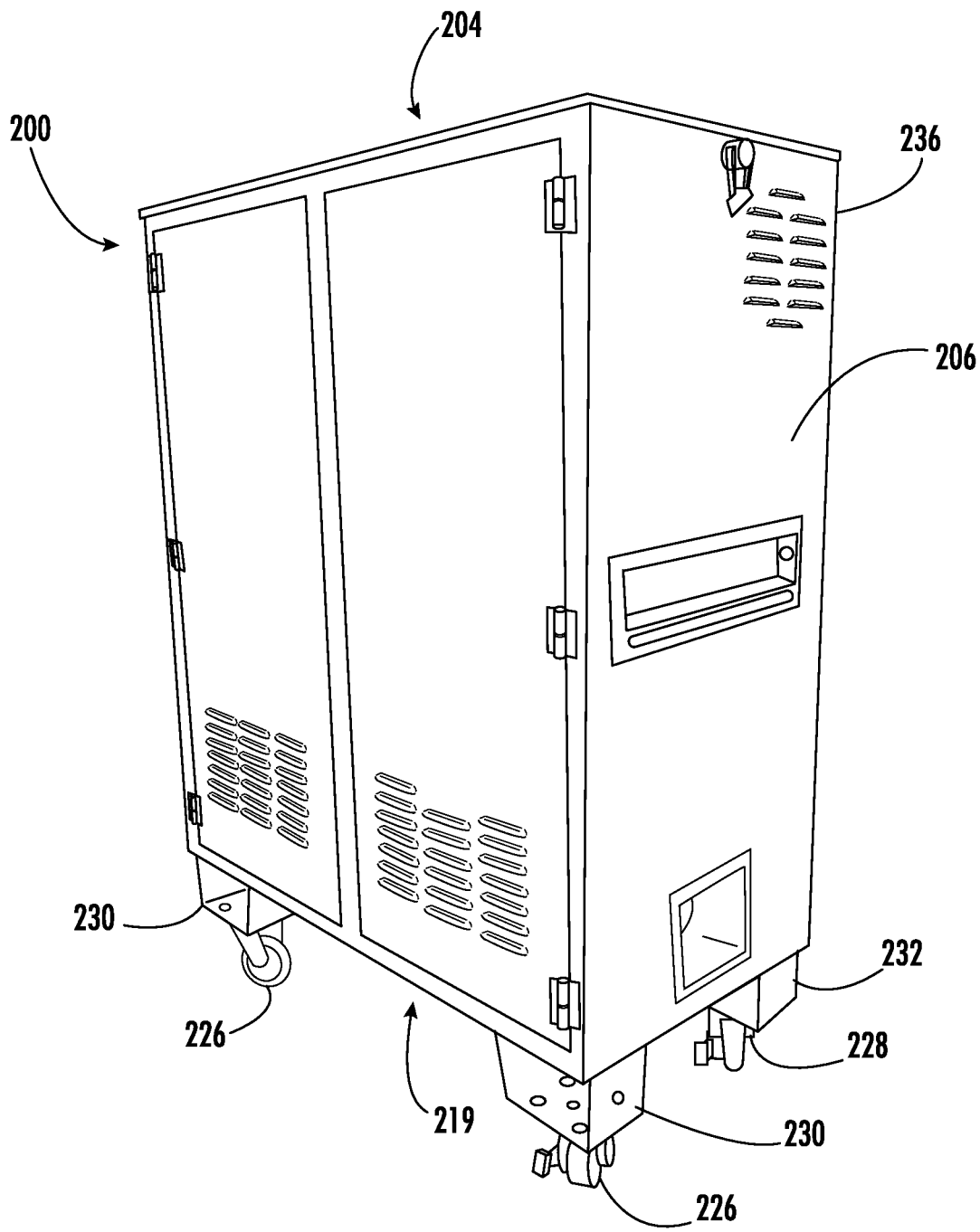
FIG. 18 is a perspective side view of another aspect of the present teachings of the charging cabinet shown in FIG. 17 with a first outer side panel.
Figure 20:
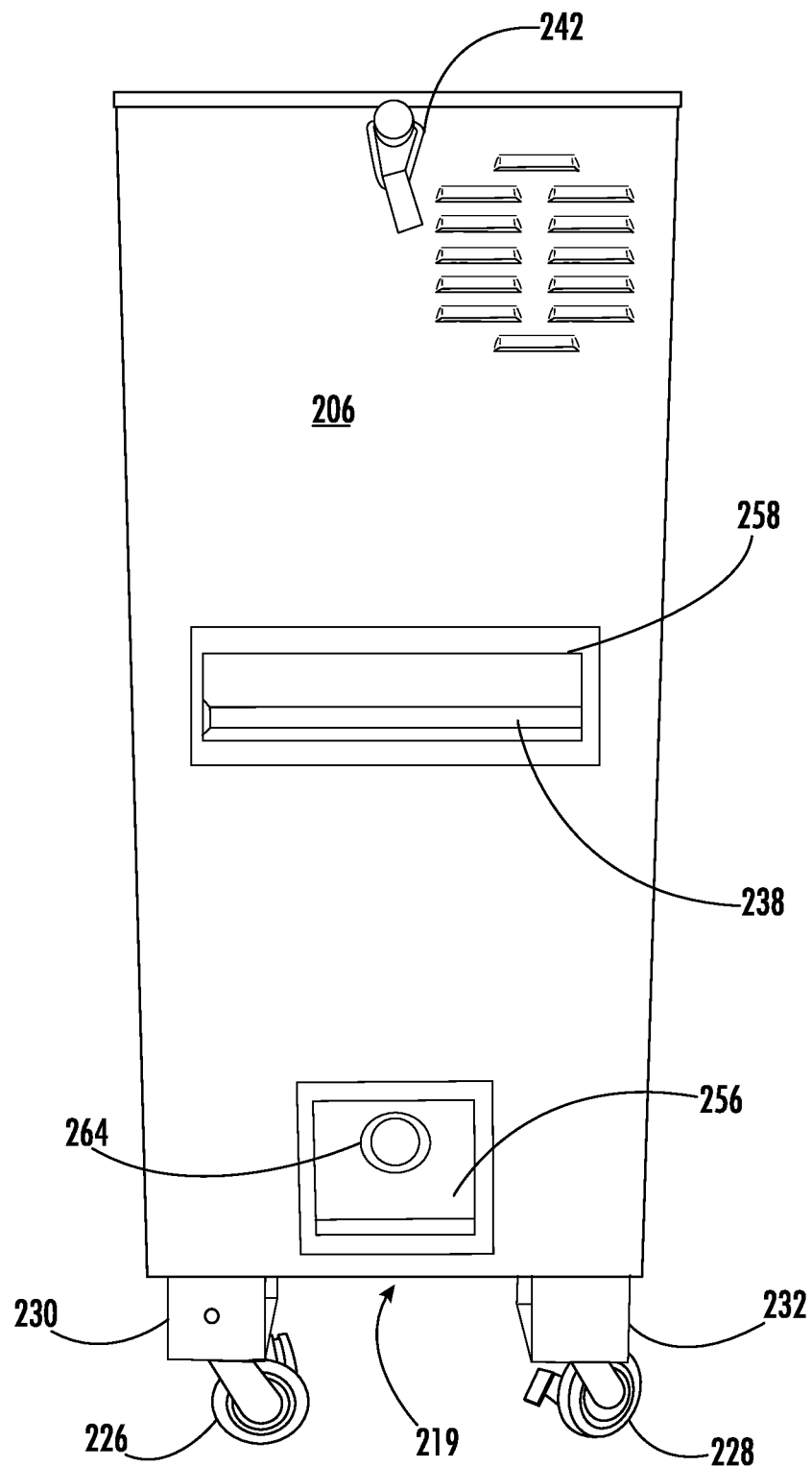
FIG. 20 is a side view of another aspect of the present teachings of the charging cabinet shown in FIG. 17 with a first outer side panel.
Figure 21:
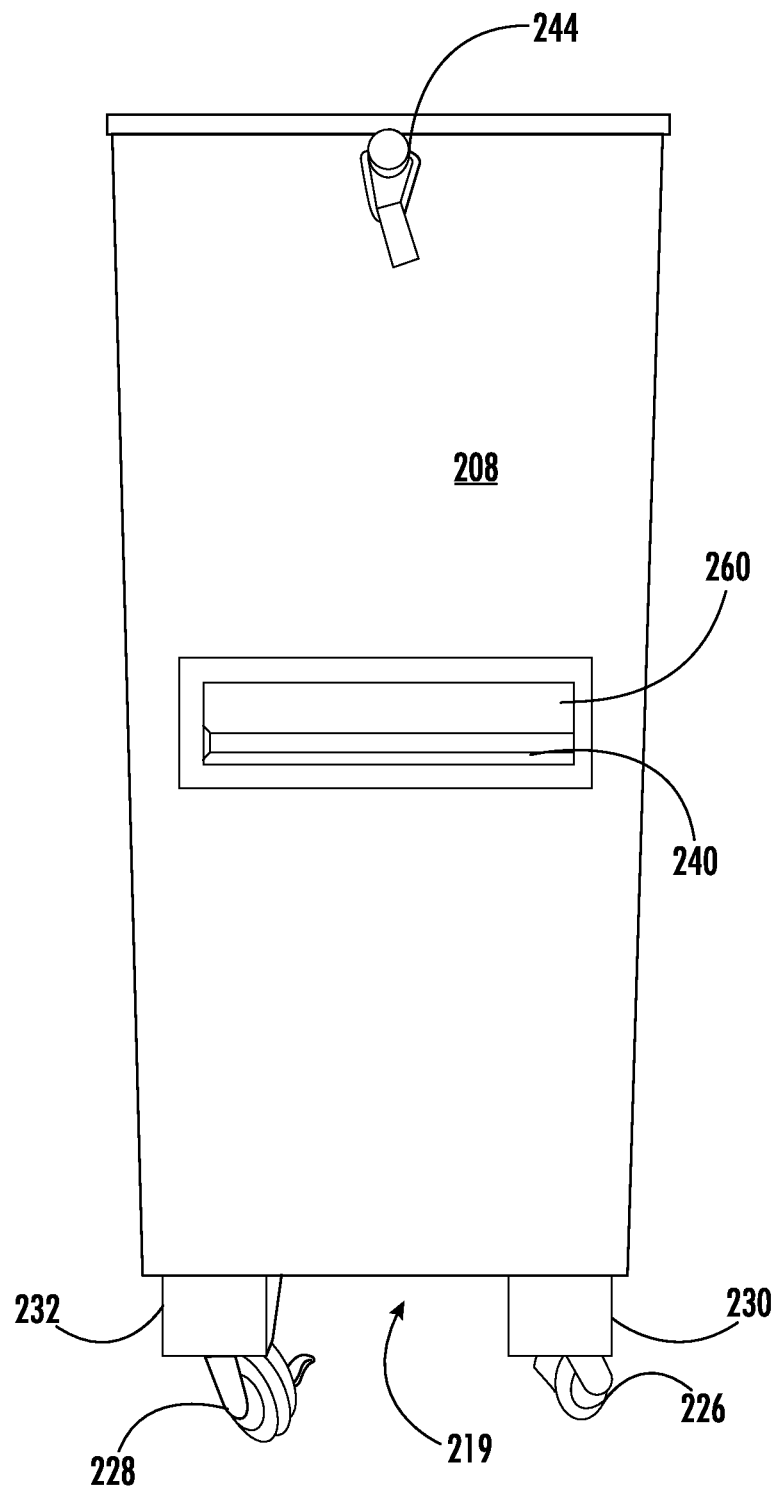
FIG. 21 is a side view of another aspect of the present teachings of the charging cabinet shown in FIG. 17 with a second outer side panel.

Now referring to FIGS. 18 and 20-21 the frame 202 further comprises an outer base panel 219. A pair of front wheel mounts 230 are fastened to the outer base panel 19 close to the first door panel 220 and the second door panel 222. In this aspect, a pair of front wheels 226 are fastened to the pair of front wheel mounts 230. In another aspect of the present teaching, a pair of rear wheel mounts 232 are fastened to the outer base panel 19 close to the outer rear panel 214. In this aspect, a pair of rear wheels 228 are fastened to the pair of rear wheel mounts 232.

Figure 17:
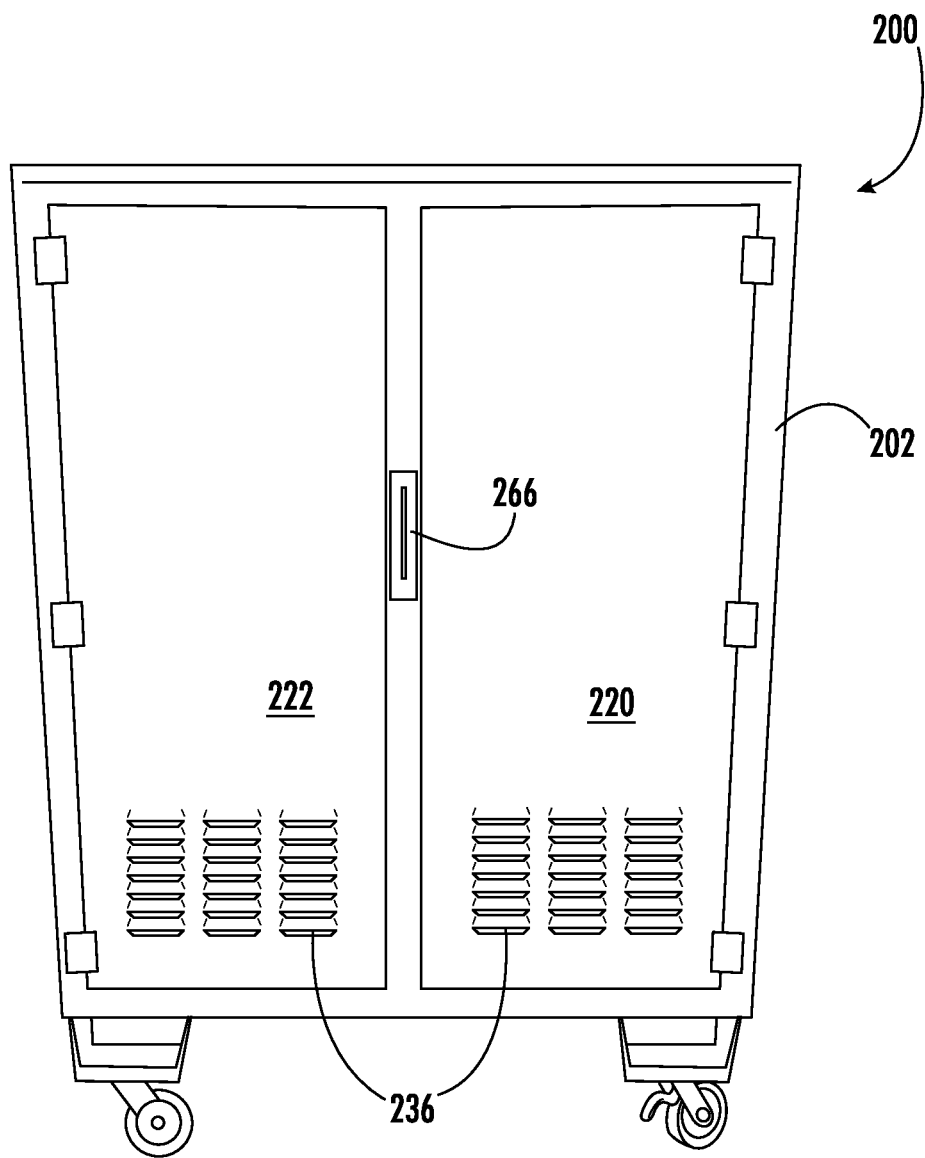
FIG. 17 is a front view of another aspect of the present teachings of the charging cabinet.

Now referring to FIGS. 17-18 and 20, a plurality of louvers 236 can be added to the first outer panel 206, to the first door panel 220, and to the second door panel 222. The plurality of louvers 236 expel heat from the charging cabinet 200 and protect the charging cabinet 200 from the ingress of water, dirt, and debris.

With reference to FIGS. 18 and 20, the first outer side panel 206 includes a first handle member mount box 258 that houses a first handle member 238. The first handle member 238 fits within the first handle member mount box 258 to reduce the overall width of the charging cabinet 200. In another aspect of the present teaching, the first outer side panel 206 includes a first hook 242 that aids in lifting and transporting the charging cabinet 200.

Further referring to FIGS. 18 and 20, a recess box 256 is fastened to the first outer side panel 206. The recess box 256 houses a daisy chain 264 that enables charging across multiple charging cabinets 200. Because the recess box 256 is mounted flush with the first outer side panel 206, the overall width of the charging cabinet 200 is reduced.

Figure 19:
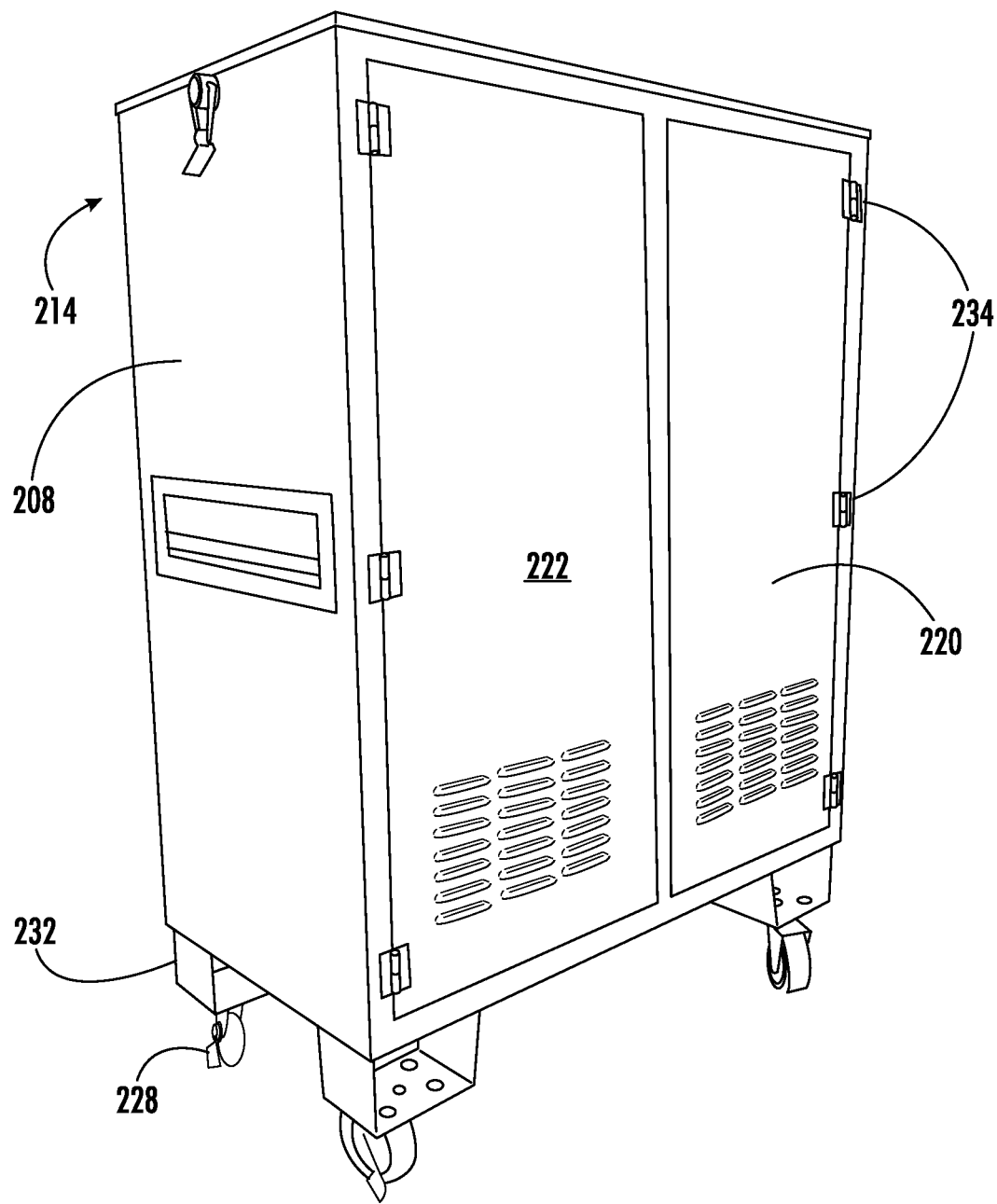
FIG. 19 is a perspective side view of another aspect of the present teachings of the charging cabinet shown in FIG. 17 with a second outer side panel.

With reference to FIGS. 19 and 21, the second outer side panel 208 includes a second handle member mount box 260 that houses a second handle member 240. The second handle member 240 fits within the second handle member mount box 240 to reduce the overall width of the charging cabinet 200. In another aspect of the present teaching, the second outer side panel 208 includes a second hook 244 that aids in lifting and transporting the charging cabinet 200.

Figure 22:
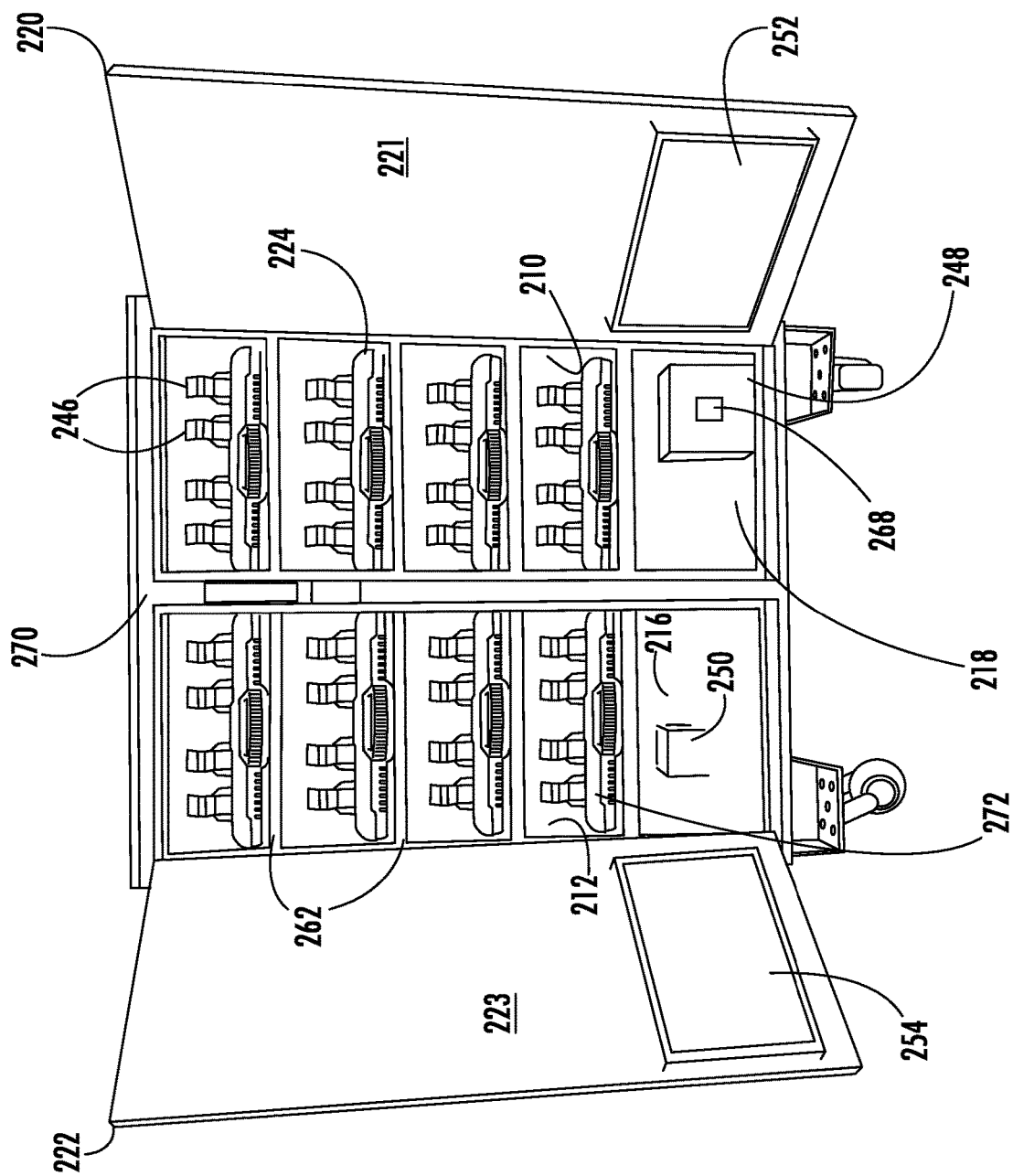
FIG. 22 is a front view of another aspect of the present teachings of the charging cabinet shown in FIG. 17 with a first door panel and a second door panel in an open position.

Now referring to FIGS. 19 and 22, a plurality of hinges 234 are mounted to the frame 202, to the first door panel 220, and to the second door panel 222. The plurality of hinges 234 enable the first door panel 220 and the second door panel 222 to form a closed position, shown in FIG. 19. Additionally, the plurality of hinges 234 enable the first door panel 220 and the second door panel 222 to form an open position, shown in FIG. 22.

Referring now to FIG. 22, the first door panel 220 and the second door panel can be in an open position to expose a first inner side panel 210, a second inner side panel 212, an inner rear panel 216, and an inner base panel 218. The first door panel 220 includes a first inner door panel 221, and the second door panel 222 includes a second inner door panel 223. In one aspect of the present teaching, the first and second inner door panels 221, 223 include a first filer 252 and a second filter 254, respectively. The first and second filters 252, 254 trap water, dust, and debris that may have evaded the plurality of louvers 236.

Further referring to FIG. 22, a cooling fan 250 is mounted to the inner rear panel 216 to vent heat from the charging cabinet 200. Positioning the cooling fan 250 close to the inner base panel 218 ensures maximum is expelled from the charging cabinet 200 in summertime conditions.

Further referring to FIGS. 17 and 22, a center vertical member 270 is located vertically and centrally between the first inner side panel 210 and the second inner side panel 212. The center vertical member 270 is fastened from the top panel 204 to the inner base panel 218. In one aspect of the present teaching, a lock member 266 is fastened to the center vertical member 270. In this aspect, when the first door panel 220 and the second door panel 222 are in the close position, shown in FIG. 17, the lock member 266 protrudes from the center vertical member 270 to enable the charging cabinet 200 to lock.

Now referring to FIG. 22, a plurality of shelf members 262 are horizontally fastened between the first inner side panel 210 and the center vertical member 270 and between the second inner side panel 212 and the center vertical member 270. In one aspect of the present teaching, a plurality of stock chargers 224 are fastened to the plurality of shelf members 262. In this aspect, the plurality of stock chargers 224 include a plurality of ports 272 that enable at least one battery 246 to fit and charge within the plurality of ports 272.

Now referring to FIGS. 20 and 22, the inner base panel 218 includes a power pack 248 that supplies power to the plurality of stock chargers 224 and to the cooling fan 250. The power pack 248 is mounted close to the first inner side panel 210 to receive the daisy chain 264 housed within the recess box 256. In one aspect of the present teaching, the power pack 248 incudes a breaker 268 that acts as a safety feature to prevent short circuiting or overload.

What is claimed is:

1. A charging cabinet comprising:
   a. a frame;
   b. a center vertical member; wherein the center vertical member includes a lock plate that engages with a lock member;
   c. a plurality of stock chargers, wherein the plurality of stock chargers have a plurality of ports for charging at least one battery;
   d. an exhaust system, configured to vent heat from the charging cabinet to cool the at least one battery;
   e. a heater, configured to warm the at least one battery;
   f. a pair of duplex receptacles;
   g. a pass-thru connector recess box, wherein the pass-thru connector recess box is angled downward;
   h. a pass-thru connector mount box, wherein the pass-thru connector mount box is angled upward;
   i. an inlet connector recess box, wherein the inlet connector recess box is angled downward; and,
   j. an inlet connector mount box, wherein the inlet connector mount box is angled upward.

2. The charging cabinet of claim 1, wherein the frame comprises: a first outer side panel; a second outer side panel that includes the pair of duplex receptacles; a first inner side panel that includes the plurality of stock chargers; a second inner side panel that includes the plurality of stock chargers; an inner rear panel; an outer rear panel; a base panel; a first door panel; and a second door panel having a handle member.

3. The charging cabinet of claim 1, wherein the center vertical member includes the plurality of stock chargers; and the center vertical member is positioned vertically between the first inner side panel and the second inner side panel; and the center vertical member is fastened from the top panel to a shelf member, wherein the shelf member extends horizontally from the first inner side panel to the second inner side panel.

4. The charging cabinet of claim 3, wherein the shelf member includes a first hole member and a second hole member to provide entry for a plurality of fan cords and a plurality of charger cords.

5. The charging cabinet of claim 1, wherein the exhaust system comprises: a pair of exhaust openings that are fastened to the outer rear panel; a pair of exhaust fans that have an integral thermostatic control, wherein the pair of exhaust fans are fastened to the inner rear panel; and a pair of louvers that are fastened to the outer rear panel to cover the pair of exhaust openings.

6. The charging cabinet of claim 1, wherein the heater is fastened vertically to the base panel; and the heater has an auxiliary thermostatic control.

7. The charging cabinet of claim 2, wherein the frame and the top panel have a plurality of hooks to aid in lifting and transporting the charging cabinet; and the frame and the top panel have a plurality of brackets to prevent tipping of the charging cabinet.

8. The charging cabinet of claim 2, wherein the base panel includes a transformer with an accessible surface; and the transformer is positioned onto the base panel to avoid contact with the pass-thru connector mount box and the inlet connector mount box.

9. The charging cabinet of claim 2, wherein the inner rear panel includes a raceway enclosure that comprises: an electrical raceway; and a DIN rail, wherein the DIN rail includes a plurality of DIN receptacles, wherein the DIN receptacles connect to the pair of exhaust fans, to the plurality of stock chargers, to the heater, to the auxiliary thermostatic control, and to a WiFi gateway, a plurality of single-pole DIN breakers that connect to the pair of duplex receptacles, and a 3-pole DIN breaker that connects to the transformer.

10. The charging cabinet of claim 1, wherein the pass-thru connector recess box is fastened to and non-perpendicular to the first outer side panel to reduce the width of the charging cabinet; and the pass-thru connector mount box is fastened to and non-perpendicular to the first inner side panel to avoid contact with the transformer.

11. The charging cabinet of claim 10, wherein the pass-thru connector recess box and the pass-thru connector mount box house a pass-thru connector comprising: a pass-thru connector first end that angularly protrudes downward from the pass-thru connector recess box; and a pass-thru connector second end that angularly protrudes upward from the pass-thru connector mount box, wherein the pass-thru connector has a connectorized output of 480V 3-phase power to chain multiple of the charging cabinets together for charging.

12. The charging cabinet of claim 1, wherein the inlet connector recess box is fastened to and non-perpendicular to the second outer side panel to reduce the width of the charging cabinet; and the inlet connector mount box is fastened to and non-perpendicular to the second inner side panel to avoid contact with the transformer.

13. The charging cabinet of claim 12, where in the inlet connector recess box and the inlet connector mount box house an inlet connector comprising: an inlet corrector first end that angularly protrudes downward from the inlet connector recess box; and an inlet connector second end that angularly protrudes upward from the inlet connector mount box; wherein the inlet connector has a connectorized input of 480V 3-phase power.

14. A charging cabinet comprising:
   a. a frame;

b. a center vertical member, wherein the center vertical member includes a lock member;

c. a plurality of stock chargers, wherein the plurality of stock chargers have a plurality of ports for charging at least one battery;

d. a cooling fan, configured to vent heat from the charging cabinet to cool the at least one battery;

e. a recess box, wherein a daisy chain is fastened within the recess box; and f. a power pack, positioned to receive a daisy chain.

15. The charging cabinet of claim 14, wherein the frame comprises: a top panel; a first outer side panel that includes the recess box, a first hook, a plurality of louvers, and a first handle mount box with a first handle member; a second outer side panel that includes a second hook and a second handle mount box with a second handle member; an outer base panel; an outer rear panel; a first door panel that includes the plurality of louvers; and a second door panel that includes the plurality of louvers.

16. The charging cabinet of claim 15, wherein the first door panel has a first inner door panel that includes a first filter; and the second door panel has a second inner door panel that includes a second filter.

17. The charging cabinet of claim 15, wherein the outer base panel includes a pair of front wheel mounts that fasten to a pair of front wheels and a pair of rear wheel mounts that fasten to a pair of rear wheels.

18. The charging cabinet of claim 15, wherein the first outer side panel has a first inner side panel; and the second outer side panel has a second inner side panel, wherein a plurality of shelf members are horizontally fastened between the first inner side member and the center vertical member and between the second inner side member and the center vertical member.

19. The charging cabinet of claim 14, wherein the power pack is fastened to an inner base panel; and the power pack is located close to the first inner side panel to receive the daisy chain and the recess box.

20. The charging cabinet of claim 14, wherein the cooling fan is fastened to an inner rear panel; wherein the cooling fan is located close to the inner base panel to vent heat from the charging cabinet.

* * * * *